US010915249B2

(12) United States Patent
Lea

(10) Patent No.: US 10,915,249 B2
(45) Date of Patent: Feb. 9, 2021

(54) APPARATUSES AND METHODS FOR IN-MEMORY OPERATIONS

(71) Applicant: Micron Technology, Inc., Boise, ID (US)

(72) Inventor: Perry V. Lea, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/746,492

(22) Filed: Jan. 17, 2020

(65) Prior Publication Data

US 2020/0150864 A1 May 14, 2020

Related U.S. Application Data

(63) Continuation of application No. 16/218,876, filed on Dec. 13, 2018, now Pat. No. 10,540,097, which is a
(Continued)

(51) Int. Cl.
*G11C 7/10* (2006.01)
*G06F 3/06* (2006.01)
(Continued)

(52) U.S. Cl.
CPC ............ *G06F 3/061* (2013.01); *G06F 3/0659* (2013.01); *G06F 3/0685* (2013.01);
(Continued)

(58) Field of Classification Search
CPC ............ G11C 11/4096; G11C 11/4091; G11C 11/4093; G11C 11/4087; G06F 3/0659
(Continued)

(56) References Cited

U.S. PATENT DOCUMENTS 4,380,046 A 4/1983 Fung
4,435,792 A 3/1984 Bechtolsheim
(Continued)

FOREIGN PATENT DOCUMENTS

CN 102141905 8/2011
EP 0214718 3/1987
(Continued)

OTHER PUBLICATIONS

Dybdahl, et al., "Destructive-Read in Embedded DRAM, Impact on Power Consumption," Apr. 2006, (10 pgs.), vol. 2, Issue 2, Journal of Embedded Computing—Issues in embedded single-chip multicore architectures.
(Continued)

*Primary Examiner* — Xiaochun L Chen
(74) *Attorney, Agent, or Firm* — Brooks, Cameron & Huebsch, PLLC

(57) ABSTRACT

The present disclosure includes apparatuses and methods for in-memory operations. An example apparatus includes a memory device including a plurality of subarrays of memory cells, where the plurality of subarrays includes a first subset of the respective plurality of subarrays and a second subset of the respective plurality of subarrays. The memory device includes sensing circuitry coupled to the first subset, the sensing circuitry including a sense amplifier and a compute component. The apparatus also includes a controller configured to direct a first movement of a number of data values from a subarray in the second subset to a subarray in the first subset and performance of a sequential plurality of operations in-memory on the number of data values by the first sensing circuitry coupled to the first subset.

20 Claims, 7 Drawing Sheets

Related U.S. Application Data continuation of application No. 15/439,522, filed on Feb. 22, 2017, now Pat. No. 10,268,389.

(51) Int. Cl.

| | |
|---|---|
| *G11C 11/4091* | (2006.01) |
| *G11C 11/4076* | (2006.01) |
| *G11C 11/4097* | (2006.01) |
| *G11C 11/408* | (2006.01) |
| *G11C 11/4093* | (2006.01) |
| *G11C 11/4096* | (2006.01) |
| *G11C 5/02* | (2006.01) |

(52) U.S. Cl.
CPC ........ *G11C 7/1006* (2013.01); *G11C 11/4076* (2013.01); *G11C 11/4087* (2013.01); *G11C 11/4091* (2013.01); *G11C 11/4093* (2013.01); *G11C 11/4096* (2013.01); *G11C 11/4097* (2013.01); *G11C 5/025* (2013.01); *G11C 2207/005* (2013.01); *G11C 2207/2245* (2013.01)

(58) Field of Classification Search
USPC ........................................................ 365/205
See application file for complete search history.

(56) References Cited

U.S. PATENT DOCUMENTS

| | | | |
|---|---|---|---|
| 4,435,793 A | 3/1984 | Ochii | |
| 4,727,474 A | 2/1988 | Batcher | |
| 4,843,264 A | 6/1989 | Galbraith | |
| 4,958,378 A | 9/1990 | Bell | |
| 4,977,542 A | 12/1990 | Matsuda et al. | |
| 5,023,838 A | 6/1991 | Herbert | |
| 5,034,636 A | 7/1991 | Reis et al. | |
| 5,201,039 A | 4/1993 | Sakamura | |
| 5,210,850 A | 5/1993 | Kelly et al. | |
| 5,253,308 A | 10/1993 | Johnson | |
| 5,276,643 A | 1/1994 | Hoffman et al. | |
| 5,325,519 A | 6/1994 | Long et al. | |
| 5,367,488 A | 11/1994 | An | |
| 5,379,257 A | 1/1995 | Matsumura et al. | |
| 5,386,379 A | 1/1995 | Ali-Yahia et al. | |
| 5,398,213 A | 3/1995 | Yeon et al. | |
| 5,440,482 A | 8/1995 | Davis | |
| 5,446,690 A | 8/1995 | Tanaka et al. | |
| 5,473,576 A | 12/1995 | Matsui | |
| 5,481,500 A | 1/1996 | Reohr et al. | |
| 5,485,373 A | 1/1996 | Davis et al. | |
| 5,506,811 A | 4/1996 | McLaury | |
| 5,615,404 A | 3/1997 | Knoll et al. | |
| 5,638,128 A | 6/1997 | Hoogenboom | |
| 5,638,317 A | 6/1997 | Tran | |
| 5,654,936 A | 8/1997 | Cho | |
| 5,678,021 A | 10/1997 | Pawate et al. | |
| 5,724,291 A | 3/1998 | Matano | |
| 5,724,366 A | 3/1998 | Furutani | |
| 5,751,987 A | 5/1998 | Mahant-Shetti et al. | |
| 5,787,458 A | 7/1998 | Miwa | |
| 5,854,636 A | 12/1998 | Watanabe et al. | |
| 5,867,429 A | 2/1999 | Chen et al. | |
| 5,870,504 A | 2/1999 | Nemoto et al. | |
| 5,915,084 A | 6/1999 | Wendell | |
| 5,935,263 A | 8/1999 | Keeth et al. | |
| 5,986,942 A | 11/1999 | Sugibayashi | |
| 5,991,209 A | 11/1999 | Chow | |
| 5,991,785 A | 11/1999 | Alidina et al. | |
| 6,005,799 A | 12/1999 | Rao | |
| 6,009,020 A | 12/1999 | Nagata | |
| 6,092,186 A | 7/2000 | Betker et al. | |
| 6,122,211 A | 9/2000 | Morgan et al. | |
| 6,125,071 A | 9/2000 | Kohno et al. | |
| 6,134,164 A | 10/2000 | Lattimore et al. | |
| 6,147,514 A | 11/2000 | Shiratake | |
| 6,151,244 A | 11/2000 | Fujino et al. | |
| 6,157,578 A | 12/2000 | Brady | |
| 6,163,862 A | 12/2000 | Adams et al. | |
| 6,166,942 A | 12/2000 | Vo et al. | |
| 6,172,918 B1 | 1/2001 | Hidaka | |
| 6,175,514 B1 | 1/2001 | Henderson | |
| 6,181,698 B1 | 1/2001 | Hariguchi | |
| 6,208,544 B1 | 3/2001 | Beadle et al. | |
| 6,226,215 B1 | 5/2001 | Yoon | |
| 6,301,153 B1 | 10/2001 | Takeuchi et al. | |
| 6,301,164 B1 | 10/2001 | Manning et al. | |
| 6,304,477 B1 | 10/2001 | Naji | |
| 6,389,507 B1 | 5/2002 | Sherman | |
| 6,418,498 B1 | 7/2002 | Martwick | |
| 6,466,499 B1 | 10/2002 | Blodgett | |
| 6,510,098 B1 | 1/2003 | Taylor | |
| 6,563,754 B1 | 5/2003 | Lien et al. | |
| 6,578,058 B1 | 6/2003 | Nygaard | |
| 6,643,755 B2 | 11/2003 | Goodhue et al. | |
| 6,731,542 B1 | 5/2004 | Le et al. | |
| 6,754,746 B1 | 6/2004 | Leung et al. | |
| 6,768,679 B1 | 7/2004 | Le et al. | |
| 6,807,614 B2 | 10/2004 | Chung | |
| 6,816,422 B2 | 11/2004 | Harnade et al. | |
| 6,819,612 B1 | 11/2004 | Achter | |
| 6,894,549 B2 | 5/2005 | Eliason | |
| 6,943,579 B1 | 9/2005 | Hazarichuk et al. | |
| 6,948,056 B1 | 9/2005 | Roth | |
| 6,950,771 B1 | 9/2005 | Fan et al. | |
| 6,950,898 B2 | 9/2005 | Merritt et al. | |
| 6,956,770 B2 | 10/2005 | Khalid et al. | |
| 6,961,272 B2 | 11/2005 | Schreck | |
| 6,965,648 B1 | 11/2005 | Smith et al. | |
| 6,985,394 B2 | 1/2006 | Kim | |
| 6,987,693 B2 | 1/2006 | Cernea et al. | |
| 7,020,017 B2 | 3/2006 | Chen et al. | |
| 7,028,170 B2 | 4/2006 | Saulsbury | |
| 7,045,834 B2 | 5/2006 | Tran et al. | |
| 7,054,178 B1 | 5/2006 | Shiah et al. | |
| 7,061,817 B2 | 6/2006 | Raad et al. | |
| 7,079,407 B1 | 7/2006 | Dimitrelis | |
| 7,173,857 B2 | 2/2007 | Kato et al. | |
| 7,187,585 B2 | 3/2007 | Li et al. | |
| 7,196,928 B2 | 3/2007 | Chen | |
| 7,260,565 B2 | 8/2007 | Lee et al. | |
| 7,260,672 B2 | 8/2007 | Garney | |
| 7,272,691 B2 | 9/2007 | Stewart et al. | |
| 7,372,715 B2 | 5/2008 | Han | |
| 7,400,532 B2 | 7/2008 | Aritome | |
| 7,406,494 B2 | 7/2008 | Magee | |
| 7,447,720 B2 | 11/2008 | Beaumont | |
| 7,454,451 B2 | 11/2008 | Beaumont | |
| 7,457,181 B2 | 11/2008 | Lee et al. | |
| 7,535,769 B2 | 5/2009 | Cernea | |
| 7,546,438 B2 | 6/2009 | Chung | |
| 7,562,198 B2 | 7/2009 | Noda et al. | |
| 7,574,466 B2 | 8/2009 | Beaumont | |
| 7,602,647 B2 | 10/2009 | Li et al. | |
| 7,663,928 B2 | 2/2010 | Tsai et al. | |
| 7,685,365 B2 | 3/2010 | Rajwar et al. | |
| 7,692,466 B2 | 4/2010 | Ahmadi | |
| 7,752,417 B2 | 7/2010 | Manczak et al. | |
| 7,791,962 B2 | 9/2010 | Noda et al. | |
| 7,796,453 B2 | 9/2010 | Riho et al. | |
| 7,805,587 B1 | 9/2010 | Van Dyke et al. | |
| 7,808,854 B2 | 10/2010 | Takase | |
| 7,827,372 B2 | 11/2010 | Bink et al. | |
| 7,869,273 B2 | 1/2011 | Lee et al. | |
| 7,898,864 B2 | 3/2011 | Dong | |
| 7,924,628 B2 | 4/2011 | Danon et al. | |
| 7,937,535 B2 | 5/2011 | Ozer et al. | |
| 7,957,206 B2 | 6/2011 | Bauser | |
| 7,979,667 B2 | 7/2011 | Allen et al. | |
| 7,996,749 B2 | 8/2011 | Ding et al. | |
| 8,042,082 B2 | 10/2011 | Solomon | |
| 8,045,391 B2 | 10/2011 | Mohklesi | |
| 8,059,438 B2 | 11/2011 | Chang et al. | |
| 8,095,825 B2 | 1/2012 | Hirotsu et al. | |

(56) References Cited

U.S. PATENT DOCUMENTS

| | | |
|---|---|---|
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shinano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2001/0053105 A1 | 12/2001 | Elliott et al. |
| 2002/0059355 A1 | 5/2002 | Peleg et al. |
| 2002/0116579 A1 | 8/2002 | Goodhue et al. |
| 2003/0167426 A1 | 9/2003 | Slobodnik |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lad et al. |
| 2006/0291282 A1 | 12/2006 | Liu et al. |
| 2007/0103986 A1 | 5/2007 | Chen |
| 2007/0118721 A1 | 5/2007 | Stewart et al. |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134226 A1 | 5/2012 | Chow |
| 2012/0135225 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0297987 A1* | 11/2013 | Gupta .................. G06F 11/1064 714/773 |
| 2013/0326154 A1 | 12/2013 | Haswell |
| 2013/0332707 A1 | 12/2013 | Gueron et al. |
| 2014/0104947 A1 | 4/2014 | Yamauchi et al. |
| 2014/0146589 A1 | 5/2014 | Park et al. |
| 2014/0185395 A1 | 7/2014 | Seo |
| 2014/0215185 A1 | 7/2014 | Danielsen |
| 2014/0250279 A1 | 9/2014 | Manning |
| 2014/0344934 A1 | 11/2014 | Jorgensen |
| 2015/0029798 A1 | 1/2015 | Manning |
| 2015/0042380 A1 | 2/2015 | Manning |
| 2015/0063052 A1 | 3/2015 | Manning |
| 2015/0078108 A1 | 3/2015 | Cowles et al. |
| 2015/0085589 A1 | 3/2015 | Lu et al. |
| 2015/0279466 A1 | 3/2015 | Manning |
| 2015/0120987 A1 | 4/2015 | Wheeler |
| 2015/0134713 A1 | 5/2015 | Wheeler |
| 2015/0270015 A1 | 9/2015 | Murphy et al. |
| 2015/0324290 A1 | 11/2015 | Leidel |
| 2015/0325272 A1 | 11/2015 | Murphy |
| 2015/0356009 A1 | 12/2015 | Wheeler et al. |
| 2015/0356022 A1 | 12/2015 | Leidel et al. |
| 2015/0357007 A1 | 12/2015 | Manning et al. |
| 2015/0357008 A1 | 12/2015 | Manning et al. |
| 2015/0357019 A1 | 12/2015 | Wheeler et al. |

(56) References Cited

U.S. PATENT DOCUMENTS

| | | |
|---|---|---|
| 2015/0357020 A1 | 12/2015 | Manning |
| 2015/0357021 A1 | 12/2015 | Hush |
| 2015/0357022 A1 | 12/2015 | Hush |
| 2015/0357023 A1 | 12/2015 | Hush |
| 2015/0357024 A1 | 12/2015 | Hush et al. |
| 2015/0357047 A1 | 12/2015 | Tiwari |
| 2016/0062672 A1 | 3/2016 | Wheeler |
| 2016/0062673 A1 | 3/2016 | Tiwari |
| 2016/0062692 A1 | 3/2016 | Finkbeiner et al. |
| 2016/0062733 A1 | 3/2016 | Tiwari |
| 2016/0063284 A1 | 3/2016 | Tiwari |
| 2016/0064045 A1 | 3/2016 | La Fratta |
| 2016/0064047 A1 | 3/2016 | Tiwari |
| 2016/0098208 A1 | 4/2016 | Wilicock |
| 2016/0098209 A1 | 4/2016 | Leidel et al. |
| 2016/0110135 A1 | 4/2016 | Wheeler et al. |
| 2016/0125919 A1 | 5/2016 | Plush |
| 2016/0154596 A1 | 6/2016 | Willcock et al. |
| 2016/0155482 A1 | 6/2016 | La Fratta |
| 2016/0188250 A1 | 6/2016 | Wheeler |
| 2016/0196142 A1 | 7/2016 | Wheeler et al. |
| 2016/0196856 A1 | 7/2016 | Tiwari et al. |
| 2016/0225422 A1 | 8/2016 | Tiwari et al. |
| 2016/0266873 A1 | 9/2016 | Tiwari et al. |
| 2016/0266899 A1 | 9/2016 | Tiwari |
| 2016/0267951 A1 | 9/2016 | Tiwari |
| 2016/0292080 A1 | 10/2016 | Leidel et al. |
| 2016/0306584 A1 | 10/2016 | Zawodny et al. |
| 2016/0306614 A1 | 10/2016 | Leidel et al. |
| 2016/0365129 A1 | 12/2016 | Willcock |
| 2016/0371033 A1 | 12/2016 | La Fratta et al. |

FOREIGN PATENT DOCUMENTS

| | | |
|---|---|---|
| EP | 2026209 | 2/2009 |
| JP | H0831168 | 2/1996 |
| JP | 2009259193 | 3/2015 |
| KR | 10-0211482 | 8/1998 |
| KR | 10-2010-0134235 | 12/2010 |
| KR | 10-2013-0049421 | 5/2013 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |
| WO | 20160371033 | 9/2016 |
| WO | 2017165273 | 9/2017 |

OTHER PUBLICATIONS

Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.

Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.

U.S. Appl. No. 13/449,082, entitled, "Methods and Apparatus for Pattern Matching," filed Apr. 17, 2012, (37 pgs.).

U.S. Appl. No. 13/743,686, entitled, "Weighted Search and Compare in a Memory Device," filed Jan. 17, 2013, (25 pgs.).

U.S. Appl. No. 13/774,636, entitled, "Memory as a Programmable Logic Device," filed Feb. 22, 2013, (30 pgs.).

U.S. Appl. No. 13/774,553, entitled, "Neural Network in a Memory Device," filed Feb. 22, 2013, (63 pgs.).

U.S. Appl. No. 13/796,189, entitled, "Performing Complex Arithmetic Functions in a Memory Device," filed Mar. 12, 2013, (23 pgs.).

International Search Report and Written Opinion for PCT Application No. PCT/US2013/043702, dated Sep. 26, 2013, (11 pgs.).

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.

Pagiamtzis, Kostas, "Content-Addressable Memory Introduction", Jun. 25, 2007, (6 pgs.), retrieved from: http://www.pagiamtzis.com/cam/camintro.

Debnath, Biplob, Bloomflash: Bloom Filter on Flash-Based Storage, 2011 31st Annual Conference on Distributed computing Systems, Jun. 20-24, 2011, 10 pgs.

Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.

Stojmenovic, "Multiplicative Circulant Networks Topological Properties and Communication Algorithms", (25 pgs.), Discrete Applied Mathematics 77 (1997) 281-305.

Boyd et al., "On the General Applicability of Instruction-Set Randomization", Jul.-Sep. 2010, (14 pgs.), vol. 7, Issue 3, IEEE Transactions on Dependable and Secure Computing.

Elliot, et al., "Computational RAM: Implementing Processors in Memory", Jan.-Mar. 1999, (10 pgs.), vol. 16, Issue 1, IEEE Design and Test of Computers Magazine.

International Search Report and Written Opinion for related PCT Application No. PCT/US2018/018290, dated May 17, 2018, 14 pages.

Office Action for related Taiwan Patent Application No. 107105505, dated Dec. 12, 2018, 22 pages.

Extended European Search Report for related EP Application No. 18758224.2, dated Nov. 26, 2020, 14 pages.

* cited by examiner

APPARATUSES AND METHODS FOR IN-MEMORY OPERATIONS

PRIORITY INFORMATION

This application is a Continuation of U.S. application Ser. No. 16/218,876, filed Dec. 13, 2018, which issues as U.S. Pat. No. 10,540,097 on Jan. 21, 2020, which is a Continuation of U.S. application Ser. No. 15/439,522, filed Feb. 22, 2017, which issued as U.S. Pat. No. 10,268,389 on Apr. 23, 2019, the contents of which are included herein by reference.

TECHNICAL FIELD

The present disclosure relates generally to semiconductor memory and methods, and more particularly, to apparatuses and methods for in-memory operations.

BACKGROUND

Memory devices are typically provided as internal, semiconductor, integrated circuits in computers or other electronic systems. There are many different types of memory including volatile and non-volatile memory. Volatile memory may require power to maintain its data, e.g., host data, error data, etc., and includes random access memory (RAM), dynamic random access memory (DRAM), static random access memory (SRAM), synchronous dynamic random access memory (SDRAM), and thyristor random access memory (TRAM), among others. Non-volatile memory may provide persistent data by retaining stored data when not powered and may include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources, e.g., one or more processors, which may retrieve and execute instructions and store the results of the executed instructions to a suitable location. A processor may comprise a number of functional units such as arithmetic logic unit (ALU) circuitry, floating point unit (FPU) circuitry, and a combinatorial logic block, for example, which may be used to execute instructions by performing an operation on data, e.g., one or more operands. As used herein, an operation may be, for example, a Boolean operation, such as AND, OR, NOT, NOT, NAND, NOR, and XOR, and/or other operations, e.g., invert, shift, arithmetic, statistics, among many other possible operations. For example, functional unit circuitry may be used to perform the arithmetic operations, such as addition, subtraction, multiplication, and division on operands, via a number of logical operations.

A number of components in an electronic system may be involved in providing instructions to the functional unit circuitry for execution. The instructions may be executed, for instance, by a processing resource such as a controller and/or host processor. Data, e.g., the operands on which the instructions will be executed, may be stored in a memory array that is accessible by the functional unit circuitry. The instructions and/or data may be retrieved from the memory array and sequenced and/or buffered before the functional unit circuitry begins to execute instructions on the data. Furthermore, as different types of operations may be executed in one or multiple clock cycles through the functional unit circuitry, intermediate results of the instructions and/or data may also be sequenced and/or buffered. A sequence to complete an operation in one or more clock cycles may be referred to as an operation cycle. Time consumed to complete an operation cycle may cost in terms of processing and computing performance and/or power consumption of a computing apparatus and/or system.

In many instances, the processing resources, e.g., processor and associated functional unit circuitry, may be external to the memory array, and data is accessed via a bus between the processing resources and the memory array to execute a set of instructions. Processing performance may be improved in a processing-in-memory device, in which a processor may be implemented internally and/or near to a memory, e.g., directly on a same chip as the memory array. A processing-in-memory device may save time by reducing and eliminating external communications and may also conserve power.

DETAILED DESCRIPTION

Figure 1A:
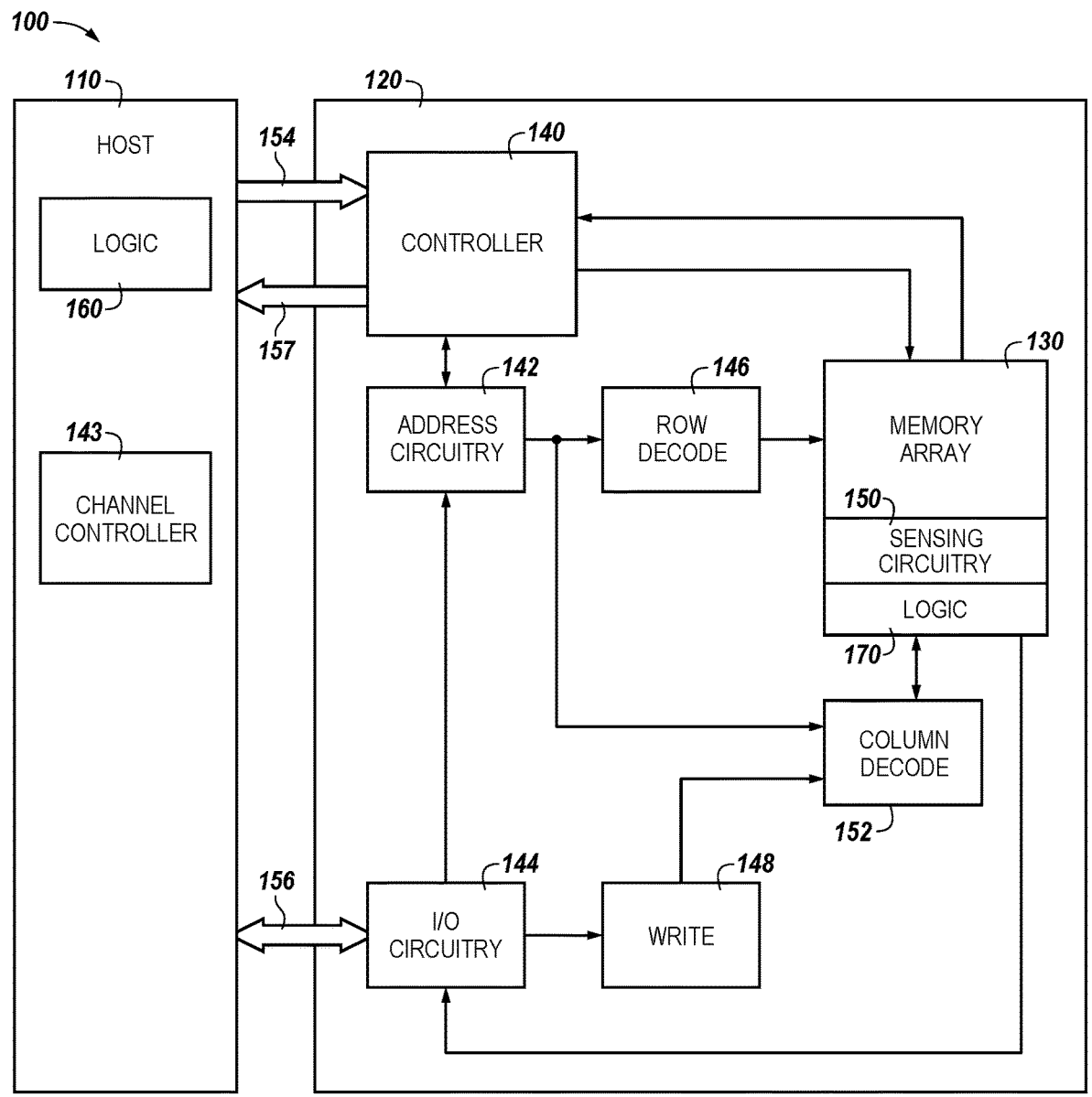
FIG. 1A is a block diagram of an apparatus in the form of a computing system including a memory device in accordance with a number of embodiments of the present disclosure.

In some implementations, a memory device may be configured to move, e.g., copy, transfer, and/or transport, a data value from a storage memory cell into a cache for performance of an operation on the data value. A single operation may be followed by movement of a data value resulting from performance of the single operation back to a storage memory cell. If another operation is to be performed on the result data value, the result data value would be moved back to the cache for performance of the other operation and moved again to a storage memory cell following the second operation in such an implementation. As such, performance of a sequential plurality of operations, e.g., a sequence of a plurality of Boolean operations performed by sensing circuitry associated with memory cells of the cache, as described herein, may involve repeated movements of original and/or partial result data values to and from a number of storage memory cells in a first sub array to a cache subarray. Such repeated movements of original and/or partial result data values may reduce a speed, rate, and/or efficiency of data processing and/or may increase power consumption.

In contrast, the present disclosure includes apparatuses and methods for in-memory operations, e.g., for processing-in-memory (PIM) structures. In at least one embodiment, the apparatus includes a memory device including a plurality of subarrays of memory cells, where the plurality of subarrays includes a first subset of the respective plurality of subarrays and a second subset of the respective plurality of subarrays. The memory device includes sensing circuitry coupled to the first subset, the sensing circuitry including a sense amplifier and a compute component. The apparatus also includes a controller configured to direct a first movement of a number of data values from a subarray in the second subset to a subarray in the first subset. The controller also is configured to direct performance of a sequential plurality of operations in-memory on the number of data values by the sense amplifier and/or the compute component of the first sensing circuitry coupled to the first subset.

The controller may also be configured to direct a second movement of a data value from the subarray in the first subset to a subarray in the second subset. For example, the controller may be configured to direct performance of the second movement of the data value, which is a result of the sequential plurality of operations performed on the number of data values moved from the subarray in the second subset. In some embodiments, the result data value may be moved back to storage in the subarray in the second subset in which the data value was previously stored. For example, the sequential plurality of operations may be performed by the sense amplifier and/or the compute component of a cache subarray in the first subset without movement of a result of the sequential plurality of operations to the storage subarray of the second subset prior to completion of a last of the sequential plurality of operations by the sense amplifier and/or the compute component of the cache subarray.

Such a sequence of data movements and/or operations performed on the data value in the first subset, e.g., cache, rather than in the second subset, e.g., storage, may be directed by a controller configured to do so, during a data processing operation, independently of a host. For example, although the host, e.g., 110 in FIG. 1A, which may not be located on the same pitch and/or chip as the memory device that includes the controller, e.g., 140 in FIG. 1A, may have commanded the data processing operation and the command may have been executed by a processor/sequencer of the controller 140, the data movements and/or operations just described may be delegated to the controller to be performed. In some embodiments, the controller 140 may be formed on chip with and function, e.g., perform operations, as shown and described in connection with FIG. 1A. As described herein, being on chip with something else is intended to mean being formed on the same chip as the memory cells in the corresponding subarrays. However, embodiments are not so limited. For example, in some embodiments, the controller 140 may be located and/or perform operations in association with the host 110, e.g., the host may instruct the controller as to data values on which operations are to be performed.

Ordinal numbers such as first and second are used herein to assist in distinguishing between similar components, e.g., subarrays of memory cells, subsets thereof, etc., and are not used to indicate a particular ordering and/or relationship between the components, unless the context clearly dictates otherwise, e.g., by using terms such as adjacent, etc. For example, a first subarray may be subarray 4 relative to subarray 0 in a bank of subarrays and the second subarray may be any other subsequent subarray, e.g., subarray 5, subarray 8, subarray 61, among other possibilities, or the second subarray may be any other preceding subarray, e.g., subarrays 3, 2, 1, or 0. Moreover, moving data values from a first subarray to a second subarray is provided as a non-limiting example of such data movement. For example, in some embodiments, the data values may be moved sequentially from and/or in parallel in each subarray to another subarray in a same bank, e.g., which may be an adjacent subarray and/or separated by a number of other subarrays, or a different bank.

A host system and a controller may perform the address resolution on an entire block of program instructions, e.g., PIM command instructions, and data and direct, e.g., control, allocation, storage, and/or movement, e.g., flow, of data and commands into allocated locations, e.g., subarrays and portions of subarrays, within a destination, e.g., target, bank. Writing data and executing commands, e.g., performing operations, as described herein, may utilize a normal DRAM write path to the DRAM device. As the reader will appreciate, while a DRAM-style PIM device is discussed with regard to examples presented herein, embodiments are not limited to a PIM DRAM implementation.

As described herein, embodiments may allow a host system to initially allocate a number of locations, e.g., sub-arrays (or "subarrays") and portions of subarrays, in one or more DRAM banks to hold, e.g., store, data, e.g., in the second subset of subarrays. However, in the interest of increased speed, rate, and/or efficiency of data processing, e.g., operations performed on the data values, the data values may be moved, e.g., copied, transferred, and/or transported, to another subarray, e.g., in the first subset of subarrays, that is configured for the increased speed, rate, and/or efficiency of data processing, as described herein.

The performance of PIM systems may be affected by memory access times, e.g., the row cycle time. An operation for data processing may include a row of memory cells in a bank being opened (accessed), the memory cells being read from and/or written to, and then the row being closed. The period of time taken for such operations may depend on the number of memory cells per compute component, e.g., compute component 231 in sensing circuitry 250 in FIG. 2, and/or the length of the digit line that connects all memory cells in a column to a respective compute component. Shorter digit lines may provide relatively improved performance per compute component but, as a result of the digit line being shorter, may also have more compute components per memory cell and, thus, a lower density of memory cells. This lower density may contribute to relatively higher power and/or die area requirements. By comparison, longer digit lines may have fewer compute components for the same memory cell density, but the longer digit lines may contribute to relatively lower performance per compute component. Hence, it may be beneficial to combine the performance benefits of short digit lines along with the memory cell density benefits of long digit lines.

A memory device, e.g., a PIM DRAM memory device, is described herein as including a plurality of subarrays with at least one of the subarrays being configured with digit lines that are shorter, e.g., have fewer memory cells per column of memory cells and/or a shorter physical length of the column, than the digit lines of the other subarrays within the memory device, e.g., in the same memory bank. The subarrays with shorter digit lines may have resultant faster access times to the memory cells and the sensing circuitry may be configured with PIM functionality, as described herein, to be used in conjunction with the faster access times.

As such, the subarrays with shorter digit lines and PIM functionality may be used as a cache to perform operations at an increased speed, rate, and/or efficiency for the subarrays configured with longer digit lines, e.g., thus having slower access times. The subarrays with longer digit lines may be used for data storage to take advantage of the relatively higher number of memory cells in their longer digit lines. In some embodiments, the subarrays with the longer digit lines may be further configured for a higher density of memory cells for more efficient data storage. For example, a higher density may be contributed to by not having PIM functionality in the sensing circuitry because the operations are performed after the data values are moved to the cache rather than on the data values in storage. Alternatively or in combination, the longer digit line subarrays may be configured, e.g., formed, using a higher density memory architecture, e.g., 1T1C memory cells, while the shorter digit line subarrays may be configured using a lower density architecture, e.g., 2T2C memory cells. Other changes to the architecture may be made to increase the speed, rate, and/or efficiency of data access in shorter digit line subarrays versus longer digit line subarrays, e.g., using different memory array architectures, such as DRAM, SRAM, etc., in the short and long digit line subarrays, varying word line lengths, among other potential changes.

Accordingly, a plurality of subarrays, with a first subset of the plurality having relatively shorter digit lines and a second subset of the plurality having relatively longer digit lines, may be included in a bank of a memory device, e.g., intermixed in various embodiments, as described herein. The subarrays with the shorter digit lines may be used as caches to perform operations for the subarrays with longer digit lines. Computation, e.g., performance of the operations, may occur either primarily or only in the subarrays with the shorter digit lines, resulting in increased performance relative to the subarrays with the longer digit lines. The subarrays with longer digit lines may be used primarily or only for data storage and, as such, may be configured for memory density. In some embodiments, the subarrays with longer digit lines may be configured with at least some PIM functionality, e.g., to provide an alternative to movement of a large amount of data on which few cumulative operations would be performed in the subarrays of the first subset, among other reasons. However, it may be preferable, regardless of whether the longer digit lines may be configured with at least some PIM functionality, to move, e.g., copy, transfer, and/or transport, the data to and from the shorter digit line subarrays to perform relatively higher speed single operations and/or sequences of operations. As such, in some embodiments, only the short digit line subarrays of the first subset may have any PIM functionality, thereby possibly saving die area and/or power consumption.

For example, the rows of memory cells in a short digit line subarray may be utilized as a number of caches for the long digit line, e.g., storage, subarrays. A controller may manage data movement between the two types of subarrays and may store information to document data being moved from source rows of particular storage subarrays to destination rows of particular cache subarrays, and vice versa. In some embodiments, the short digit line subarrays may operate as write-back caches from which the controller automatically returns a data value or a series of data values after completion of an operation thereon. However, as described herein, the controller may be configured to direct performing a sequential plurality of operations by sensing circuitry associated with a short digit line subarray operating as a cache without movement of a result of the respective plurality of operations back to a long digit line, e.g., storage, subarray prior to completion of a last of the sequential plurality of operations.

A bank in a memory device might include a plurality of subarrays of memory cells in which a plurality of partitions may each include a respective grouping of the plurality of the subarrays. In various embodiments, an I/O line shared by a plurality of partitions, e.g., a data bus for inter-partition and/or intra-partition data movement, as described herein, may be configured to separate the plurality of subarrays into the plurality of partitions by selectably connecting and disconnecting the partitions using isolation circuitry associated with the shared I/O line to form separate portions of the shared I/O line. As such, a shared I/O line associated with isolation circuitry at a plurality of locations along its length may be used to separate the partitions of subarrays into effectively separate blocks in various combinations, e.g., numbers of subarrays in each partition, depending on whether various subarrays and/or partitions are connected via the portions of shared I/O line, etc., as directed by a controller. This may enable block data movement within individual partitions to occur substantially in parallel.

Isolation of the partitions may increase speed, rate, and/or efficiency of data movement within each partition and in a combination of a plurality of partitions, e.g., some or all the partitions, by the data movements being performed in parallel, e.g., substantially at the same point in time, in each partition or combinations of partitions. This may, for example, reduce time otherwise spent moving, e.g., copying, transferring, and/or transporting, data sequentially between various short and/or long digit line subarrays selectably coupled along a shared I/O line in an array of memory cells. The parallel nature of such data movement may allow for local movement of all or most of the data values in the subarrays of the partitions such that the movement may be several times faster. For example, the movement may be faster by a factor approximating the number of partitions, e.g., with four partitions, parallel movement of the data values in the subarrays of each partition may be performed in approximately one-fourth the time taken without using the partitions described herein.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and structural changes may be made without departing from the scope of the present disclosure.

As used herein, designators such as "X", "Y", "N", "M", etc., particularly with respect to reference numerals in the drawings, indicate that a number of the particular feature so designated may be included. It is also to be understood that the terminology used herein is for the purpose of describing particular embodiments only, and is not intended to be limiting. As used herein, the singular forms "a", "an", and "the" may include both singular and plural referents, unless the context clearly dictates otherwise. In addition, "a number of", "at least one", and "one or more", e.g., a number of memory arrays, may refer to one or more memory arrays, whereas a "plurality of" is intended to refer to more than one of such things. Furthermore, the words "may" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically or for access to and movement (transmission) of commands and data, as appropriate to the context. The terms "data" and "data values" are used interchangeably herein and may have the same meaning, as appropriate to the context.

As used herein, data movement is an inclusive term that includes, for instance, copying, transferring, and/or transporting data values from a source location to a destination location. Data may, for example, be moved from a long digit line, e.g., storage, subarray to a short digit line, e.g., cache, subarray via an I/O line shared by respective sensing component stripes of the long and short digit line subarrays, as described herein. Copying the data values may indicate that the data values stored (cached) in a sensing component stripe are copied and moved to another subarray via the shared I/O line and that the original data values stored in the row of the subarray may remain unchanged. Transferring the data values may indicate that the data values stored (cached) in the sensing component stripe are copied and moved to another subarray via the shared I/O line and that at least one of the original data values stored in the row of the subarray may be changed, e.g., by being erased and/or by a subsequent write operation, as described herein. Transporting the data values may be used to indicate the process by which the copied and/or transferred data values are moved, e.g., by the data values being placed on the shared I/O line from the source location and transported to the destination location.

The figures herein follow a numbering convention in which the first digit or digits correspond to the figure number and the remaining digits identify an element or component in the figure. Similar elements or components between different figures may be identified by the use of similar digits. For example, 108 may reference element "08" in FIG. 1, and a similar element may be referenced as 208 in FIG. 2. As will be appreciated, elements shown in the various embodiments herein may be added, exchanged, and eliminated so as to provide a number of additional embodiments of the present disclosure. In addition, the proportion and the relative scale of the elements provided in the figures are intended to illustrate certain embodiments of the present disclosure and should not be taken in a limiting sense.

FIG. 1A is a block diagram of an apparatus in the form of a computing system 100 including a memory device 120 in accordance with a number of embodiments of the present disclosure. As used herein, a memory device 120, controller 140, channel controller 143, memory array 130, sensing circuitry 150, including sense amplifiers and compute components, and peripheral sense amplifier and logic 170 might each also be separately considered a respective "apparatus."

In previous approaches, data may be transferred from the array and sensing circuitry, e.g., via a bus comprising input/output (I/O) lines, to a processing resource such as a processor, microprocessor, and compute engine, which may comprise ALU circuitry and other functional unit circuitry configured to perform the appropriate operations. However, transferring data from a memory array and sensing circuitry to such processing resource(s) may involve significant power consumption. Even if the processing resource is located on a same chip as the memory array, significant power may be consumed in moving data out of the array to the compute circuitry, which may involve performing a sense line (which may be referred to herein as a digit line or data line) address access, e.g., firing of a column decode signal, in order to transfer data from sense lines onto I/O lines, e.g., local and global I/O lines, moving the data to the array periphery, and providing the data to the compute function.

Furthermore, the circuitry of the processing resource(s), e.g., a compute engine, may not conform to pitch rules associated with a memory array. For example, the cells of a memory array may have a $4F^2$ or $6F^2$ cell size, where "F" is a feature size corresponding to the cells. As such, the devices, e.g., logic gates, associated with ALU circuitry of previous PIM systems may not be capable of being formed on pitch with the memory cells, which may affect chip size and memory density, for example.

For example, the sensing circuitry 150 described herein may be formed on a same pitch as a pair of complementary sense lines. As an example, a pair of complementary memory cells may have a cell size with a $6F^2$ pitch, e.g., 3F×2F. If the pitch of a pair of complementary sense lines for the complementary memory cells is 3F, then the sensing circuitry being on pitch indicates the sensing circuitry, e.g., a sense amplifier and corresponding compute component per respective pair of complementary sense lines, is formed to fit within the 3F pitch of the complementary sense lines.

Furthermore, the circuitry of the processing resource(s), e.g., a compute engine, such as an ALU, of various prior systems may not conform to pitch rules associated with a memory array. For example, the memory cells of a memory array may have a $4F^2$ or $6F^2$ cell size. As such, the devices, e.g., logic gates, associated with ALU circuitry of previous systems may not be capable of being formed on pitch with the memory cells, e.g., on a same pitch as the sense lines, which may affect chip size and/or memory density, for example. In the context of some computing systems and subsystems, e.g., a central processing unit (CPU), data may be processed in a location that is not on pitch and/or on chip with memory, e.g., memory cells in the array, as described herein. The data may be processed by a processing resource associated with a host, for instance, rather than on pitch with the memory.

In contrast, a number of embodiments of the present disclosure may include the sensing circuitry 150, e.g., including sense amplifiers and/or compute components, being formed on pitch with the memory cells of the array. The sensing circuitry 150 may be configured for, e.g., capable of, performing compute functions, e.g., logical operations.

PIM capable device operations may use bit vector based operations. As used herein, the term "bit vector" is intended to mean a number of bits on a bit vector memory device, e.g., a PIM device, stored in a row of an array of memory cells and/or in sensing circuitry. Thus, as used herein a "bit vector operation" is intended to mean an operation that is performed on a bit vector that is a portion of virtual address space and/or physical address space, e.g., used by a PIM device. In some embodiments, the bit vector may be a physically contiguous number of bits on the bit vector memory device stored physically contiguous in a row and/or in the sensing circuitry such that the bit vector operation is performed on a bit vector that is a contiguous portion of the virtual address space and/or physical address space. For example, a row of virtual address space in the PIM device may have a bit length of 16K bits, e.g., corresponding to 16K complementary pairs of memory cells in a DRAM configuration. Sensing circuitry 150, as described herein, for such a 16K bit row may include a corresponding 16K processing elements, e.g., compute components, as described herein, formed on pitch with the sense lines selectably coupled to corresponding memory cells in the 16 bit row. A compute component in the PIM device may operate as a one bit processing element on a single bit of the bit vector of the row of memory cells sensed by the sensing circuitry 150, e.g., sensed by and/or stored in a sense amplifier paired with the compute component, as described herein.

In various embodiments described herein, a number of bit vectors may be stored in memory of the memory device 120. In some embodiments, the bit vectors may include a result of performance of a sequential plurality of operations in-memory in the memory array 130 of the memory device 120. For example, the result data value from performance of the sequential plurality of operations may be moved from the memory array 130 to be stored in a vector register 159, e.g., a particular row and/or register of a plurality of vector registers 159, instead of and/or in addition to being stored in the memory array 130. In some embodiments, vector registers 159 may be associated with, e.g., selectably coupled to, the controller 140. The vector registers 159 may, in some embodiments, represent virtual and/or physical registers accessible by the host 110, e.g., via the controller 140. A particular file in the vector registers 159 may store virtual addresses, e.g., base virtual addresses, of elements of the memory device 120. A memory element (also referred to as a computational element) may store an amount of data that is operated on in one logical operation, e.g., of a sequential plurality of operations as described herein. The memory element also may refer to a number of memory cells that store the amount of data. In various embodiments, the vector register may be configured to enable operations on the result data value in addition to those performed by the sequential plurality of operations. For example, the storage of the result data value, e.g., a plurality of bits forming the bit vector, may be selectably offset a number of memory cells in the selected destination in the vector register relative to storage of the respective data value in the memory array 130, e.g., a corresponding number of memory cells in a source row of the first subset e.g., cache subarray 125-0.

A number of embodiments of the present disclosure include sensing circuitry formed on pitch with sense lines of a corresponding array of memory cells. The sensing circuitry may be capable of performing data sensing and/or compute functions, e.g., depending on whether the sensing circuitry is associated with a short digit line or a long digit line subarray, and storage of data local to the array of memory cells.

In order to appreciate the improved data movement, e.g., copying, transferring, and/or transporting, techniques described herein, a discussion of an apparatus for implementing such techniques, e.g., a memory device having PIM capabilities and an associated host, follows. According to various embodiments, program instructions, e.g., PIM commands, involving a memory device having PIM capabilities may distribute implementation of the PIM commands and/or data over multiple sensing circuitries that may implement operations and/or may move and store the PIM commands and/or data within the memory array, e.g., without having to transfer such back and forth over an address and control (A/C) and data bus between a host and the memory device. Thus, data for a memory device having PIM capabilities may be accessed and used in less time and/or using less power. For example, a time and/or power advantage may be realized by increasing the speed, rate, and/or efficiency of data being moved around and stored in a computing system in order to process requested memory array operations, e.g., reads, writes, logical operations, etc.

The system 100 illustrated in FIG. 1A may include a host 110 coupled, e.g., connected, to memory device 120, which includes the memory array 130. Host 110 may be a host system such as a personal laptop computer, a desktop computer, a tablet computer, a digital camera, a smart phone, and/or a memory card reader, among various other types of hosts. Host 110 may include a system motherboard and/or backplane and may include a number of processing resources, e.g., one or more processors, microprocessors, or some other type of controlling circuitry. The system 100 may include separate integrated circuits or both the host 110 and the memory device 120 may be on the same integrated circuit. The system 100 may be, for instance, a server system and/or a high performance computing (HPC) system and/or a portion thereof. Although the example shown in FIG. 1A illustrates a system having a Von Neumann architecture, embodiments of the present disclosure may be implemented in non-Von Neumann architectures, which may not include one or more components, e.g., CPU, ALU, etc., often associated with a Von Neumann architecture.

For clarity, description of the system 100 has been simplified to focus on features with particular relevance to the present disclosure. For example, in various embodiments, the memory array 130 may be a DRAM array, SRAM array, STT RAM array, PCRAM array, TRAM array, RRAM array, NAND flash array, and/or NOR flash array, for instance. The memory array 130 may include memory cells arranged in rows coupled by access lines (which may be referred to herein as word lines or select lines) and columns coupled by sense lines (which may be referred to herein as digit lines or data lines). Although a single memory array 130 is shown in FIG. 1A, embodiments are not so limited. For instance, memory device 120 may include a number of memory arrays 130, e.g., a number of banks of DRAM cells, NAND flash cells, etc., in addition to a number of subarrays, as described herein.

The memory device 120 may include address circuitry 142 to latch address signals provided over a data bus 156, e.g., an I/O bus from the host 110, by I/O circuitry 144, e.g., provided to external ALU circuitry and to DRAM data lines (DQs) via local I/O lines and global I/O lines. As used herein, DRAM DQs may enable input of data to and output of data from a bank, e.g., from and to the controller 140 and/or host 110, via a bus, e.g., data bus 156. During a write operation, voltage and/or current variations, for instance, may be applied to a DQ, e.g., a pin. These variations may be translated into an appropriate signal and stored in a selected memory cell. During a read operation, a data value read from a selected memory cell may appear at the DQ once access is complete and the output is enabled. At other times, DQs may be in state such that the DQs do not source or sink current and do not present a signal to the system. This also may reduce DQ contention when two or more devices, e.g., banks, share the data bus, as described herein.

Status and exception information may be provided from the controller 140 on the memory device 120 to a channel controller 143, for example, through an out-of-band bus 157, which in turn may be provided from the channel controller 143 to the host 110. The channel controller 143 may include a logic component 160 to allocate a plurality of locations, e.g., controllers for subarrays, in the arrays of each respective bank to store bank commands, application instructions, e.g., as sequences of operations, and arguments (PIM commands) for the various banks associated with operation of each of a plurality of memory devices, e.g., 120-0, 120-1, . . . , 120-N. The channel controller 143 may dispatch commands, e.g., PIM commands, to the plurality of memory devices 120-1, . . . , 120-N to store those program instructions within a given bank of a memory device.

Address signals are received through address circuitry 142 and decoded by a row decoder 146 and a column decoder 152 to access the memory array 130. Data may be sensed (read) from memory array 130 by sensing voltage and/or current changes on sense lines (digit lines) using a number of sense amplifiers, as described herein, of the sensing circuitry 150. A sense amplifier may read and latch a page, e.g., a row, of data from the memory array 130. Additional compute components, as described herein, may be coupled to the sense amplifiers and may be used in combination with the sense amplifiers to sense, store, e.g., cache and buffer, perform compute functions, e.g., operations, and/or move data. The I/O circuitry 144 may be used for bi-directional data communication with host 110 over the data bus 156, e.g., a 64 bit wide data bus. The write circuitry 148 may be used to write data to the memory array 130. The function of the column decoder 152 circuitry, however, is distinguishable from the column select circuitry 358 described herein that is configured to implement data movement operations with respect to, for example, particular columns of a subarray and corresponding operation units in an operations stripe.

Controller 140, e.g., bank control logic and/or sequencer, may decode signals, e.g., commands, provided by control bus 154 from the host 110. These signals may include chip enable signals, write enable signals, and/or address latch signals that may be used to control operations performed on the memory array 130, including data sense, data store, data movement, data write, and/or data erase operations, among other operations. In various embodiments, the controller 140 may be responsible for executing instructions from the host 110 and accessing the memory array 130. The controller 140 may be a state machine, a sequencer, or some other type of controller. The controller 140 may control shifting data, e.g., right or left, in a row of an array, e.g., memory array 130.

Examples of the sensing circuitry 150 are described further below, e.g., in FIGS. 2 and 3. For instance, in a number of embodiments, the sensing circuitry 150 may include a number of sense amplifiers and/or a number of compute components, which may serve as an accumulator and may be used to perform operations as directed by a controller 140 and/or a respective subarray controller (not shown) of each subarray, e.g., on data associated with complementary sense lines.

In a number of embodiments, the sensing circuitry 150 may be used to perform operations using data stored in memory array 130 as inputs and to participate in movement of the data for transfer, writing, logic, and storage operations to a different location in the memory array 130 without transferring the data via a sense line address access, e.g., without firing a column decode signal. As such, various compute functions may be performed using, and within, sensing circuitry 150 rather than (or in association with) being performed by processing resources external to the sensing circuitry 150, e.g., by a processor associated with host 110 and other processing circuitry, such as ALU circuitry, located on device 120, such as on controller 140 or elsewhere.

In various previous approaches, data associated with an operand, for instance, would be read from memory via sensing circuitry and provided to external ALU circuitry via I/O lines, e.g., via local I/O lines and global I/O lines. The external ALU circuitry could include a number of registers and would perform compute functions using the operands, and the result would be transferred back to the array via the I/O lines.

In contrast, in a number of embodiments of the present disclosure, sensing circuitry 150 is configured to perform operations on data stored in memory array 130 and store the result back to the memory array 130 without enabling a local I/O line and global I/O line coupled to the sensing circuitry 150. The sensing circuitry 150 may be formed on pitch with sense lines for the memory cells of the array. Additional peripheral sense amplifiers and/or logic 170, e.g., subarray controllers that each execute instructions for performing a respective operation, may be coupled to the sensing circuitry 150. The sensing circuitry 150 and the peripheral sense amplifier and logic 170 may cooperate in performing operations, according to some embodiments described herein.

As such, in a number of embodiments, circuitry external to memory array 130 and sensing circuitry 150 is not needed to perform compute functions, as the sensing circuitry 150 may perform the appropriate operations in order to perform such compute functions in a sequence of instructions without the use of an external processing resource. Therefore, the sensing circuitry 150 may be used to complement or to replace, at least to some extent, such an external processing resource (or at least reduce the bandwidth consumption of transfer of data to and/or from such an external processing resource).

In a number of embodiments, the sensing circuitry 150 may be used to perform operations, e.g., to execute a sequence of instructions, in addition to operations performed by an external processing resource, e.g., host 110. For instance, either of the host 110 and the sensing circuitry 150 may be limited to performing only certain operations and/or a certain number of operations.

Enabling a local I/O line and global I/O line may include enabling, e.g., turning on, activating, a transistor having a gate coupled to a decode signal, e.g., a column decode signal, and a source/drain coupled to the I/O line. However, embodiments are not limited to not enabling a local I/O line and global I/O line. For instance, in a number of embodiments, the sensing circuitry 150 may be used to perform operations without enabling column decode lines of the array. However, the local I/O line(s) and global I/O line(s) may be enabled in order to transfer a result to a suitable location other than back to the memory array 130, e.g., to an external register.

Figure 1B:
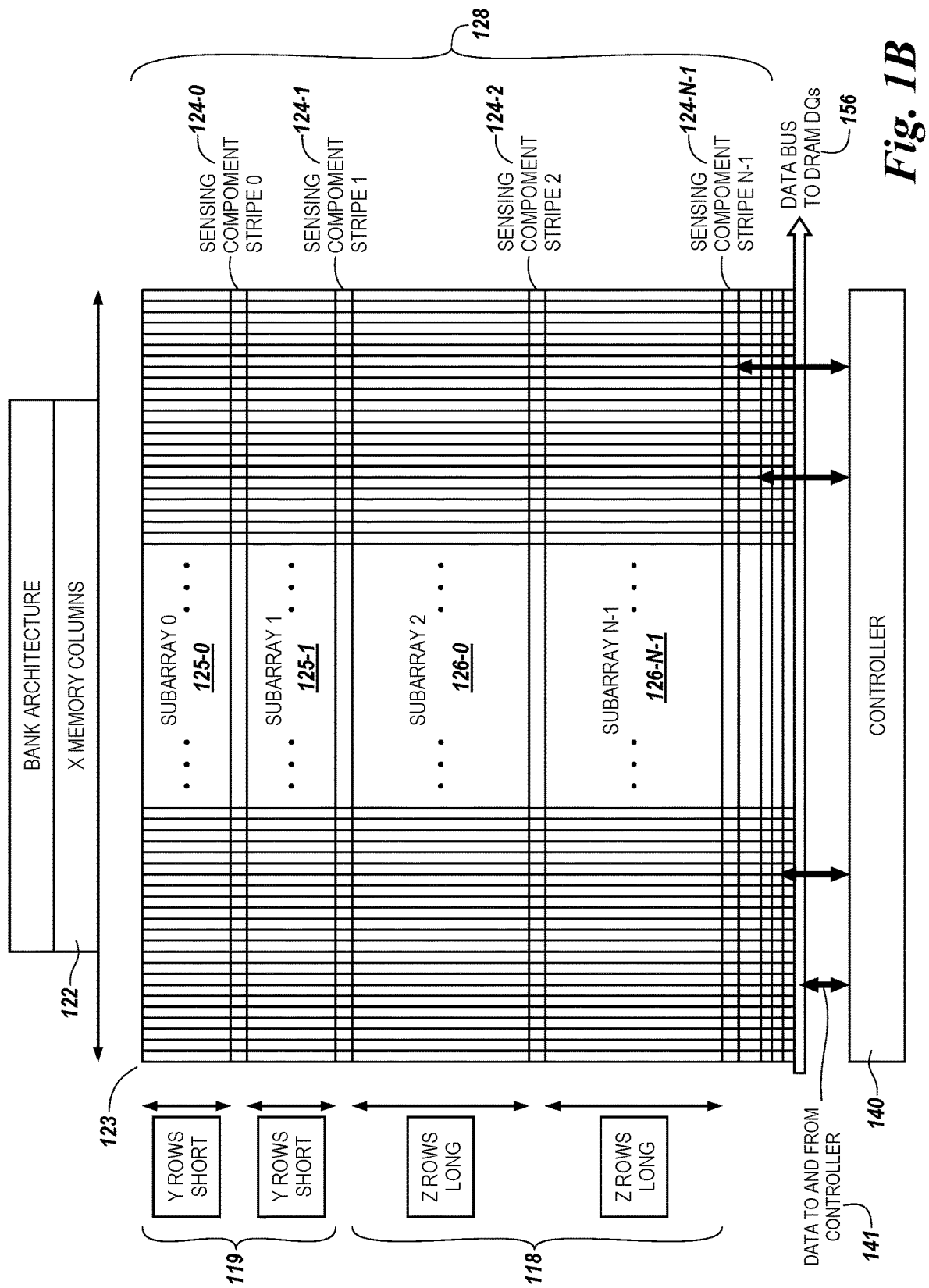
FIG. 1B is a block diagram of a bank section of a memory device in accordance with a number of embodiments of the present disclosure.

FIG. 1B is a block diagram of a bank section 123 of a memory device in accordance with a number of embodiments of the present disclosure. Bank section 123 may represent an example section of a number of bank sections of a bank of a memory device, e.g., bank section 0, bank section 1, . . . , bank section M. As shown in FIG. 1B, a bank section 123 may include a plurality of memory columns 122 shown horizontally as X, e.g., 16,384 columns in an example DRAM bank and bank section. Additionally, the bank section 123 may be divided into subarray 0, subarray 1, . . . , and subarray N−1, e.g., 32, 64, 128, or various uneven numbers of subarrays, as shown at 125-0 and 125-1 as examples of two short digit line, e.g., cache, subarrays and at 126-0, . . . , 126-N−1 as examples of a number of long digit line, e.g., storage, subarrays in the same bank section. The configurations of embodiments, e.g., the numbers and/or positioning of the short and long digit line subarrays, illustrated in FIG. 1B are shown for purposes of clarity and are not limited to these configurations.

The short and long digit line subarrays are respectively separated by amplification regions configured to be coupled to a data path, e.g., the shared I/O line described herein. As such, the short digit line subarrays 125-0 and 125-1 and the long digit line subarrays 126-0, . . . , 126-N−1 may each have amplification regions 124-0, 124-1, . . . , 124-N−1 that correspond to sensing component stripe 0, sensing component stripe 1, . . . , and sensing component stripe N−1, respectively.

Each column 122 may be configured to be coupled to sensing circuitry 150, as described in connection with FIG. 1A and elsewhere herein. As such, each column in a subarray may be coupled individually to at least one of a sense amplifier and/or a compute component that contributes to a sensing component stripe for that subarray. For example, as shown in FIG. 1B, the bank section 123 may include sensing component stripe 0, sensing component stripe 1, ..., sensing component stripe N−1 that each have sensing circuitry 150 with at least sense amplifiers that may, in various embodiments, be used as registers, cache, and/or data buffering, etc., and that are coupled to each column 122 in the subarrays 125-0 and 125-1 and 126-0, ..., 126-N−1.

In some embodiments, a compute component may be coupled to each sense amplifier within the sensing circuitry 150 in each respective sensing component stripe coupled to a short digit line subarray, e.g., in sensing component stripes 124-0 and 124-1 coupled respectively to the short digit line subarrays 125-0 and 125-1. However, embodiments are not so limited. For example, in some embodiments, there may not be a 1:1 correlation between the number of sense amplifiers and compute components, e.g., there may be more than one sense amplifier per compute component or more than one compute component per sense amplifier, which may vary between subarrays, partitions, banks, etc.

Each of the of the short digit line subarrays 125-0 and 125-1 may include a plurality of rows 119 shown vertically as Y, e.g., each subarray may include 512 rows in an example DRAM bank. Each of the of the long digit line subarrays 126-0, ..., 126-N−1 may include a plurality of rows 118 shown vertically as Z, e.g., each subarray may include 1024 rows in an example DRAM bank. Example embodiments are not limited to the example horizontal and vertical orientation of columns and/or numbers of rows described herein.

Implementations of PIM DRAM architecture may perform processing at the sense amplifier and compute component level, e.g., in a sensing component stripe. Implementations of PIM DRAM architecture may allow a finite number of memory cells to be connected to each sense amplifier, e.g., around 1K or 1024 memory cells. A sensing component stripe may include from around 8K to around 16K sense amplifiers. For example, a sensing component stripe for a long digit line subarray may include 16K sense amplifiers and may be configured to couple to an array of 1K rows and around 16K columns with a memory cell at each intersection of the rows and columns so as to yield 1K (1024) memory cells per column. By comparison, a sensing component stripe for a short digit line subarray may include 16K sense amplifiers and compute components and may be configured to couple to an array of, for example, at most half of the 1K rows of the long digit line subarray so as to yield 512 memory cells per column. In some embodiments, the number of sense amplifiers and/or compute components in respective sensing component stripes, e.g., corresponding to a number of memory cells in a row, may vary between at least some of the short digit line subarrays in comparison to the long digit line subarrays.

The numbers of rows, columns, and memory cells per column and/or the ratio of the numbers of memory cells between columns in the long and short digit line subarrays just presented are provided by way of example and not by way of limitation. For example, the long digit line subarrays may have columns that each have a respective 1024 memory cells and the short digit line subarrays may have columns that each have either a respective 512, 256, or 128 memory cells, among other possible numbers that are less than 512. The long digit line subarrays may, in various embodiments, have less than or more than 1024 memory cells per column, with the number of memory cells per column in the short digit line subarrays configured as just described. Alternatively or in addition, cache subarrays may be formed with a digit line length less than, equal to, or greater than the digit line length of the long digit line subarrays (storage subarrays) such that the cache subarrays are not the short digit line subarrays just described. For example, the configuration of the digit lines and/or the memory cells of the cache subarrays may provide faster computation than the configuration of the storage subarrays, e.g., 2T2C instead of 1T1C, SRAM instead of DRAM, etc.

Accordingly, the number of rows of memory cells in a cache subarray and/or the corresponding number of memory cells per digit line may be less than, equal to, or greater than the number of rows of memory cells in a storage subarray and/or the corresponding number of memory cells per digit line of the storage subarrays. In some embodiments, a number of memory cells in a row of a long digit line subarray may differ from a number of memory cells in a row of a short digit line subarray. For example, a memory cell of a short digit line subarray configured as 2T2C may be approximately twice as wide as a memory cell of a long digit line subarray configured as 1T1C because the 2T2C memory cell has two transistors and two capacitors whereas the 1T1C memory cell has one transistor and one capacitor. In order to integrate widths of these two configurations of subarrays on a chip and/or bank architecture, the number of memory cells in the rows may be adjusted, e.g., such that a short digit line subarray may, for example, have around half as many memory cells as in a row of a long digit line subarray. A controller may have or be directed by instructions to accommodate movement of data values between these two configurations of subarrays.

In some embodiments, long digit line subarray 126-N−1 may be subarray 32 in 128 subarrays and may be a last subarray in a first direction in a first partition of four partitions of subarrays, as described herein. Isolation stripes (not shown) may include a number of isolation transistors configured to selectably, e.g., as directed by controller 140, connect and disconnect portions of a selected shared I/O line. Selectably enabling, e.g., activating and inactivating, the isolation transistors connects and disconnects movement between partitions via the shared I/O line of data values to and from the sense amplifiers and/or compute components, e.g., in sensing component stripes, as described herein.

As such, the plurality of subarrays 125-0 and 125-1 and 126-0, ..., 126-N−1, the plurality of sensing component stripes 124-0, 124-1, ..., 124-N−1, and the isolation stripe 172 may be considered as a single partition 128. In some embodiments, however, depending upon the direction of the data movement, a single isolation stripe may be shared by two adjacent partitions.

As shown in FIG. 1B, the bank section 123 may be associated with controller 140. The controller 140 shown in FIG. 1B may, in various examples, represent at least a portion of the functionality embodied by and contained in the controller 140 shown in FIG. 1A. The controller 140 may direct, e.g., control, input of commands and/or data 141 to the bank section 123 and output of data from the bank section 123, e.g., to the host 110, along with control of data movements in the bank section 123, as described herein. The bank section 123 may include a data bus 156, e.g., a 64 bit wide data bus, to DRAM DQs, which may correspond to the data bus 156 described in connection with FIG. 1A. The controller 140, e.g., in response to a command, may be delegated responsibility for directing the movement and/or operations performed on the data values in the in-memory operations described herein.

Figure 1C:
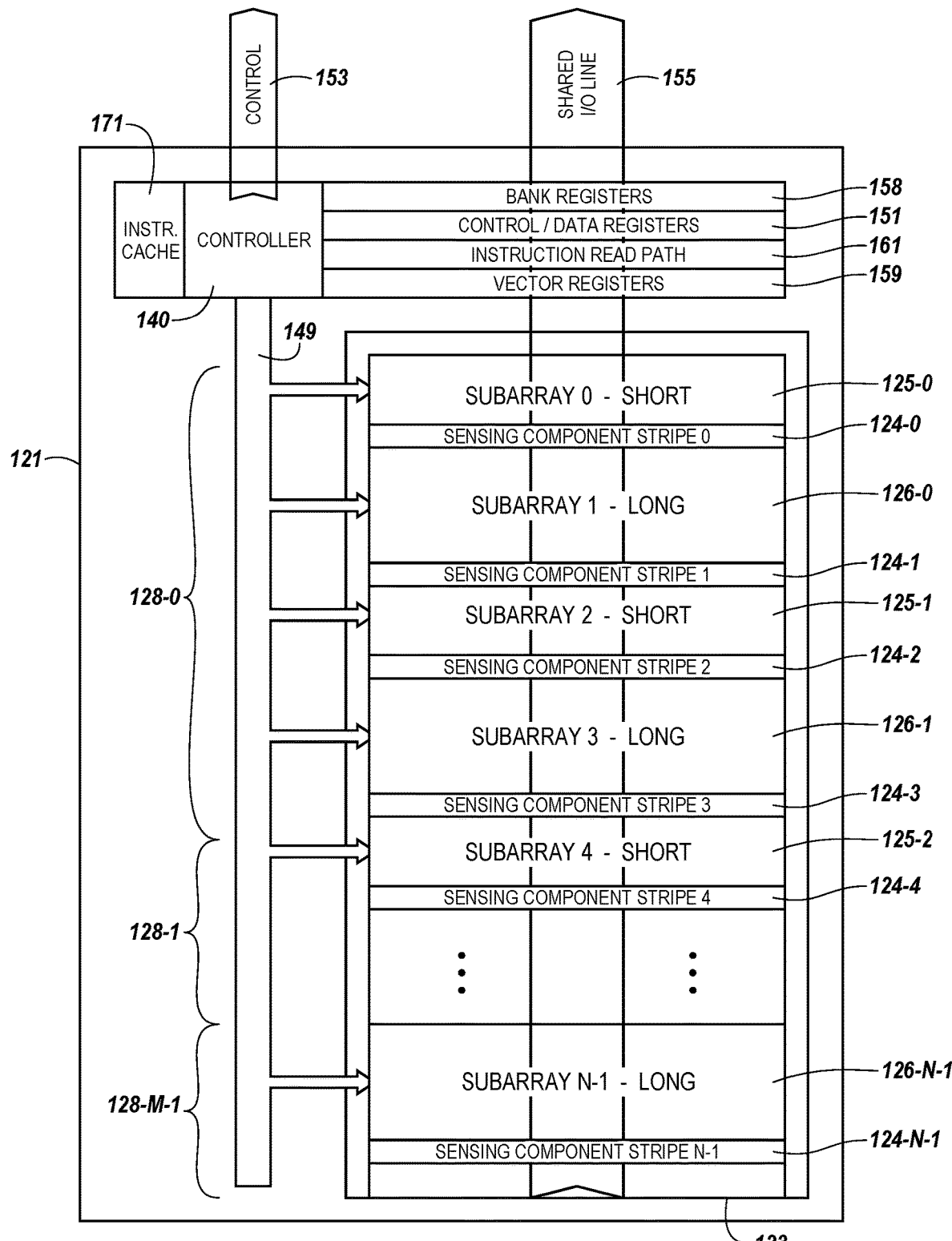
FIG. 1C is a block diagram of a bank of a memory device in accordance with a number of embodiments of the present disclosure.

FIG. 1C is a block diagram of a bank 121 of a memory device in accordance with a number of embodiments of the present disclosure. Bank 121 may represent an example bank of a memory device, e.g., bank 0, bank 1, . . . , bank M−1. As shown in FIG. 1C, a bank 121 may include an A/C path 153, e.g., a bus, coupled to a controller 140. Again, the controller 140 shown in FIG. 1C may, in various examples, represent at least a portion of the functionality embodied by and contained in the controller 140 shown in FIGS. 1A and 1B.

As shown in FIG. 1C, a bank 121 may include a plurality of bank sections, e.g., bank section 123. As further shown in FIG. 1C, a bank section 123 may be subdivided into a plurality of subarrays, e.g., subarray 0, subarray 1, . . . , subarray N−1 shown at 125-0, 125-1, and 125-3 for short digit line subarrays and 126-0, 126-1, . . . , 126-N−1 for long digit line subarrays. The configurations of the numbers and/or positioning of the short and long digit line subarrays illustrated in FIG. 1C are shown for purposes of clarity and are not limited to these configurations. Although a bank section 123 may be configured as shown with a short digit line subarray 125-0 on top of a long digit line subarray 126-0, then followed by another short digit line subarray 125-1 on top of another long digit line subarray 126-1 with a total of four subarrays evenly interspersed at 1:1 ratio, e.g., in a partition 128-0, other numbers and/or ratios of short and/or long digit line subarrays are possible. For example, any feasible number of short and/or long digit line subarrays may be included in a bank section 123 and/or a partition 128 thereof in any ordering arrangement determined to be suitable for a particular implementation, e.g., with ratios of 1:1, 1:2, 1:4, 1:8, etc., of the short digit line subarrays to the long digit line subarrays with each grouping of one or more short digit line subarrays positioned adjacent a group of one or more long digit line subarrays, among other configurations. Accordingly, in some embodiments, more than one short digit line subarray may be serially positioned adjacent to each other and/or more than one long digit line subarray may be serially positioned adjacent to each other.

The plurality of subarrays shown at 125-0, 125-1, and 125-3 for short digit line subarrays and 126-0, 126-1, . . . , 126-N−1 for long digit line subarrays may each be coupled to and/or separated by sensing component stripes 124-0, 124-1, . . . , 124-N−1 that may include sensing circuitry 150 and logic circuitry 170. As noted, the sensing component stripes 124-0, 124-1, . . . , 124-N−1 each include sensing circuitry 150, having at least sense amplifiers configured to couple to each column of memory cells in each subarray, as shown in FIG. 2 and described further in connection with FIGS. 3, 4A, and 4B. The subarrays and associated sensing component stripes may be divided into a number of partitions, e.g., 128-0, 128-1, . . . , 128-M−1, that share an I/O line 155, as described further herein.

As shown schematically in FIG. 1C, a bank 121 and each section 123 of the bank may include a shared I/O line 155 as a data path, e.g., bus, coupled to a plurality of control/data registers in an instruction and/or data, e.g., program instructions (PIM commands), read path and coupled to a plurality of bank sections, e.g., bank section 123, in a particular bank 121. The controller 140 may be configured to receive a command to start performance of an operation in a given bank, e.g., bank 121-1. The controller 140 may be configured to retrieve instructions and/or constant data, e.g., using shared I/O line 155 coupled to control and data registers 151, from the plurality of locations for the particular bank and perform an operation using the compute component of the sensing circuity 150. The controller 140 may cache retrieved instructions and/or constant data local to the particular bank, e.g., in instruction cache 171 and/or logic circuitry 170.

As described herein, an I/O line may be selectably shared by a plurality of partitions, subarrays, rows, and/or particular columns of memory cells via the sensing component stripe coupled to each of the subarrays. For example, the sense amplifier and/or compute component of each of a selectable subset of a number of columns, e.g., eight column subsets of a total number of columns, may be selectably coupled to each of the plurality of shared I/O lines for data values stored (cached) in the sensing component stripe to be moved, e.g., transferred, transported, and/or fed, to each of the plurality of shared I/O lines. Because the singular forms "a", "an", and "the" may include both singular and plural referents herein, "a shared I/O line" may be used to refer to "a plurality of shared I/O lines", unless the context clearly dictates otherwise. Moreover, "shared I/O lines" is an abbreviation of "plurality of shared I/O lines".

In some embodiments, the controller 140 may be configured to direct, e.g., provide instructions (commands) and data to a plurality of locations of a particular bank 121 in the memory array 130 and to the sensing component stripes 124-0, 124-1, . . . , 124-N−1, via the shared I/O line 155 coupled to control and data registers 151. For example, the control and data registers 151 may relay the instructions to be executed by the sense amplifiers and/or the compute components of the sensing circuity 150 in the sensing component stripes 124-0, 124-1, . . . , 124-N−1. FIG. 1C illustrates, for example, the controller 140 as being associated with the instruction cache 171 and coupled via a write path 149 to each of the short digit line subarrays 125-0, 125-1, and 125-3, long digit line subarrays 126-0, 126-1, . . . , 126-N−1, and/or sensing component stripes 124-0, 124-1, . . . , 124-N−1 in the bank 121.

However, the shared I/O line 155 and/or the connection circuitry 232 described herein may be configured, e.g., formed and/or enabled, to move a result of performance of a sequential plurality of operations to a suitable location other than back to the first subset 125 and/or the second subset 126 of subarrays of memory array 130. For example, the result data value may, in various embodiments, be moved to an external register via the shared I/O line 155 and/or the connection circuitry 232. As shown in FIG. 1C, embodiments of such external registers may include a number of bank registers 158 and/or vector registers 159 associated with, e.g., selectably coupled to, the controller 140 of the bank 121 of the memory device 120.

As described in connection with FIG. 1B, a plurality of subarrays, e.g., the four subarrays 125-0, 125-1, 126-0, and 126-1 shown by way of example in FIG. 1C, and their respective sensing component stripes may constitute a first partition 128-0. An isolation stripe (not shown) may be positioned in between subarray 3 (126-1) and subarray 4 (125-2) such that subarray 126-1 is a last subarray in a first direction, e.g., downward in the context of FIG. 1C, of the first partition 128-0 and subarray 125-2 is a first subarray in the first direction of a second partition 128-1. A number of subarrays and their respective sensing component stripes may extend further in the first direction until a second isolation stripe (not shown) is positioned between the second partition 128-1 and a first subarray 126-N−1 of a third partition 128-M−1. As previously indicated, the subarrays may be arranged in any order in each bank section 123 and/or partition 128 such that, for example, the short digit line subarrays 125-0 and 125-2 may be the first subarrays, respectively, in partitions 128-0 and 128-1, whereas long digit line subarray 126-N-1 may be the first subarray in partition 128-M-1, among other possible configurations.

Embodiments, however, are not so limited. For example, in various embodiments, there may be any number of short digit line subarrays 125 and any number of long digit line subarrays 126 in the bank section 123, which may be separated by isolation stripes into any number of partitions, e.g., as long as there is a combination of at least one short digit line subarray with at least one long digit line subarray in the various partitions. In various embodiments, the partitions may each include a same number or a different number of short and/or long digit line subarrays, sensing component stripes, etc., depending on the implementation.

Figure 2:
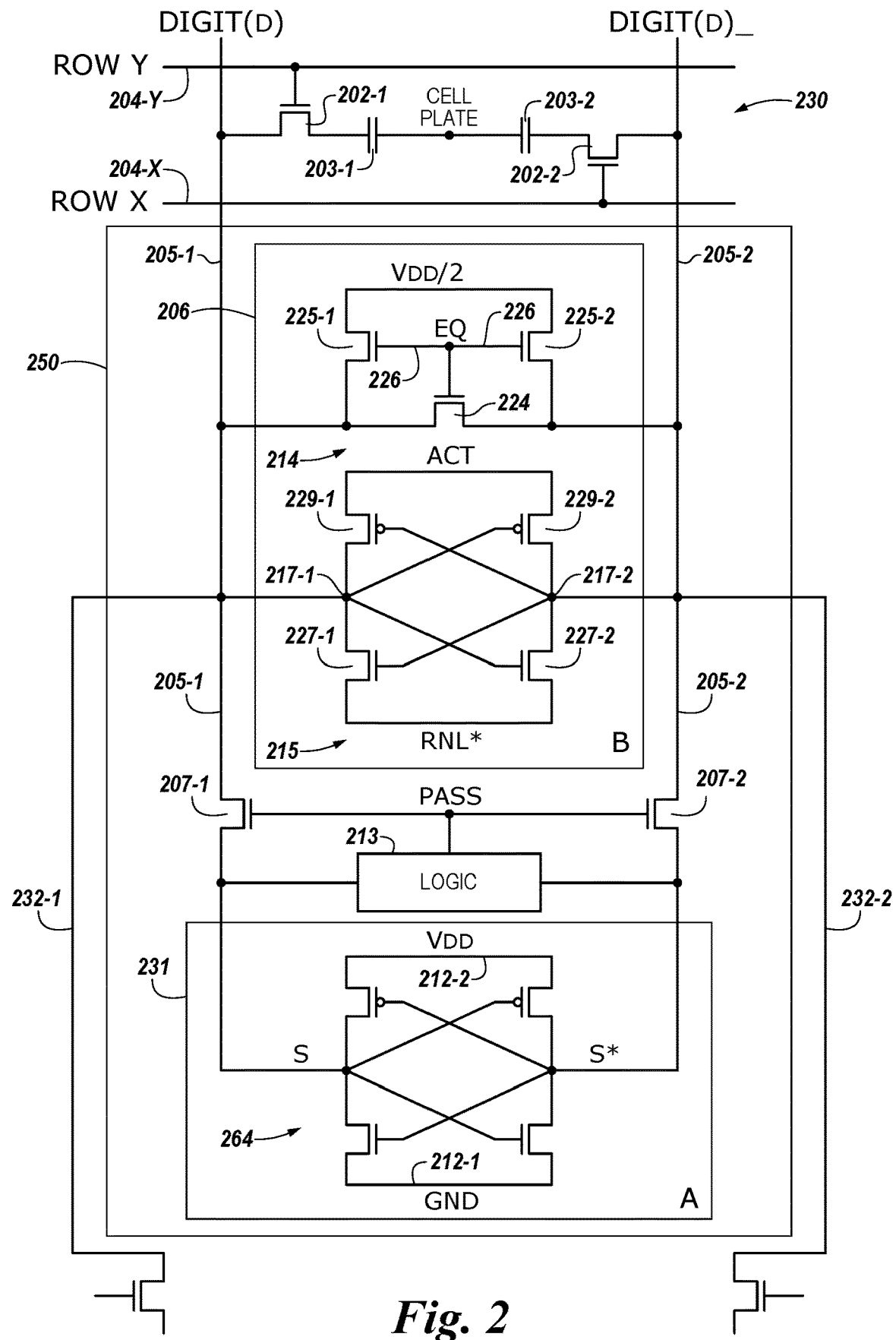
FIG. 2 is a schematic diagram illustrating sensing circuitry of a memory device in accordance with a number of embodiments of the present disclosure.

FIG. 2 is a schematic diagram illustrating sensing circuitry 250 in accordance with a number of embodiments of the present disclosure. The sensing circuitry 250 may correspond to sensing circuitry 150 shown in FIG. 1A.

A memory cell may include a storage element, e.g., capacitor, and an access device, e.g., transistor. For instance, a first memory cell may include transistor 202-1 and capacitor 203-1, and a second memory cell may include transistor 202-2 and capacitor 203-2, etc. In this embodiment, the memory array 230 is a DRAM array of 1T1C (one transistor one capacitor) memory cells, although other embodiments of configurations may be used, e.g., 2T2C with two transistors and two capacitors per memory cell. In a number of embodiments, the memory cells may be destructive read memory cells, e.g., reading the data stored in the cell destroys the data such that the data originally stored in the cell may be refreshed after being read.

Figure 3:
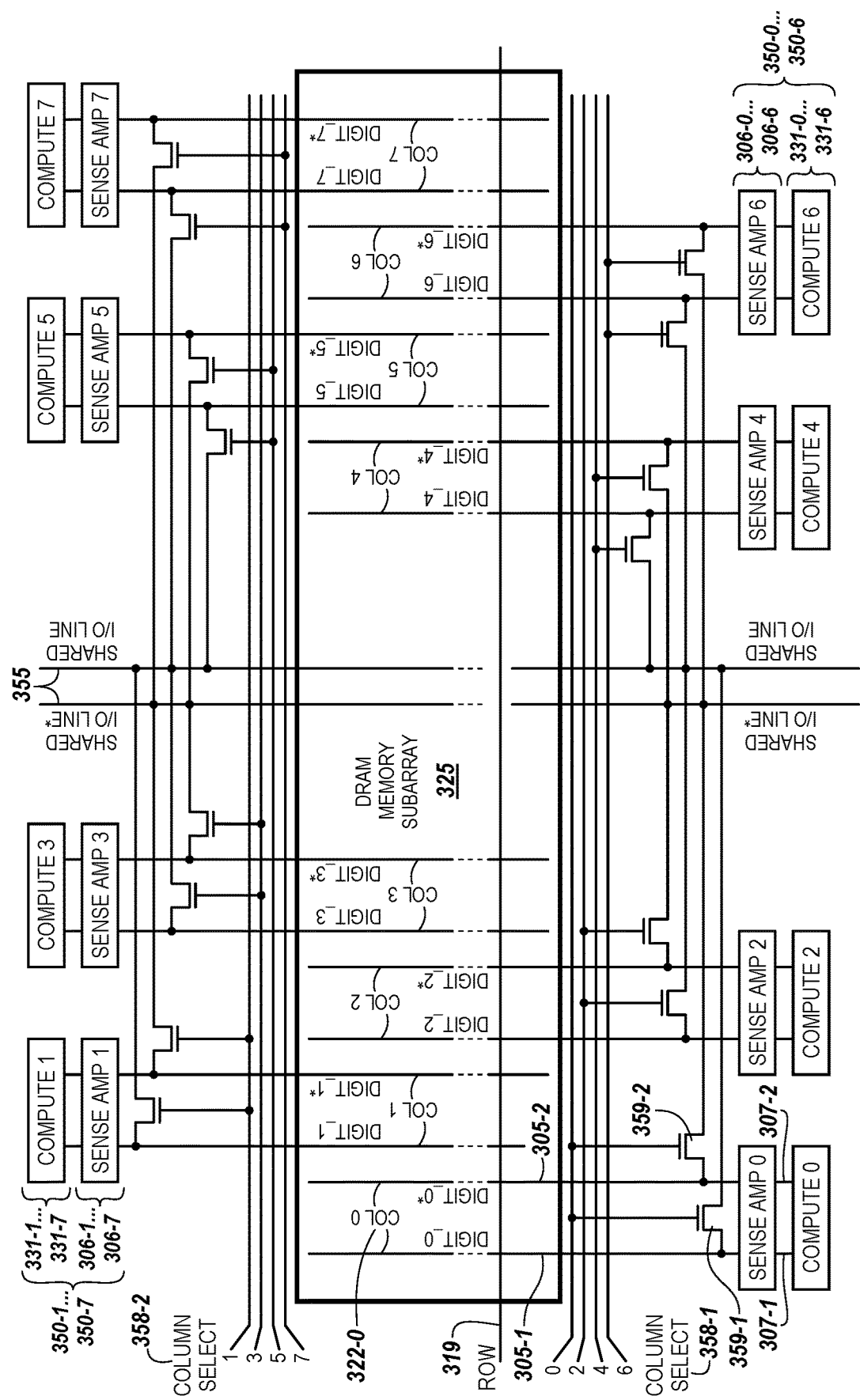
FIG. 3 is a schematic diagram illustrating circuitry for data movement in a memory device in accordance with a number of embodiments of the present disclosure.
Figure 4A:
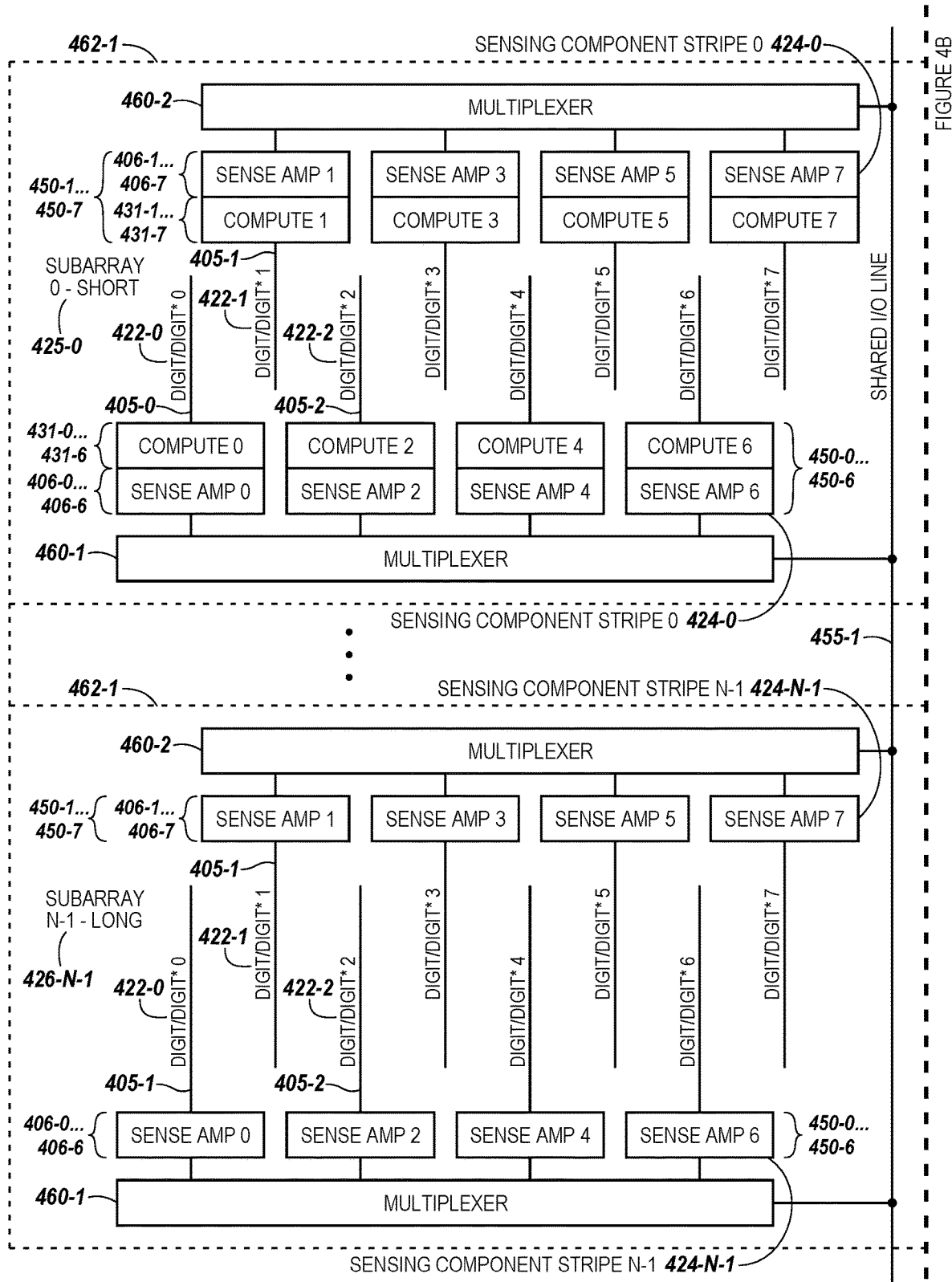
FIGS. 4A and 4B are another schematic diagram illustrating circuitry for data movement in a memory device in accordance with a number of embodiments of the present disclosure.
Figure 4B:
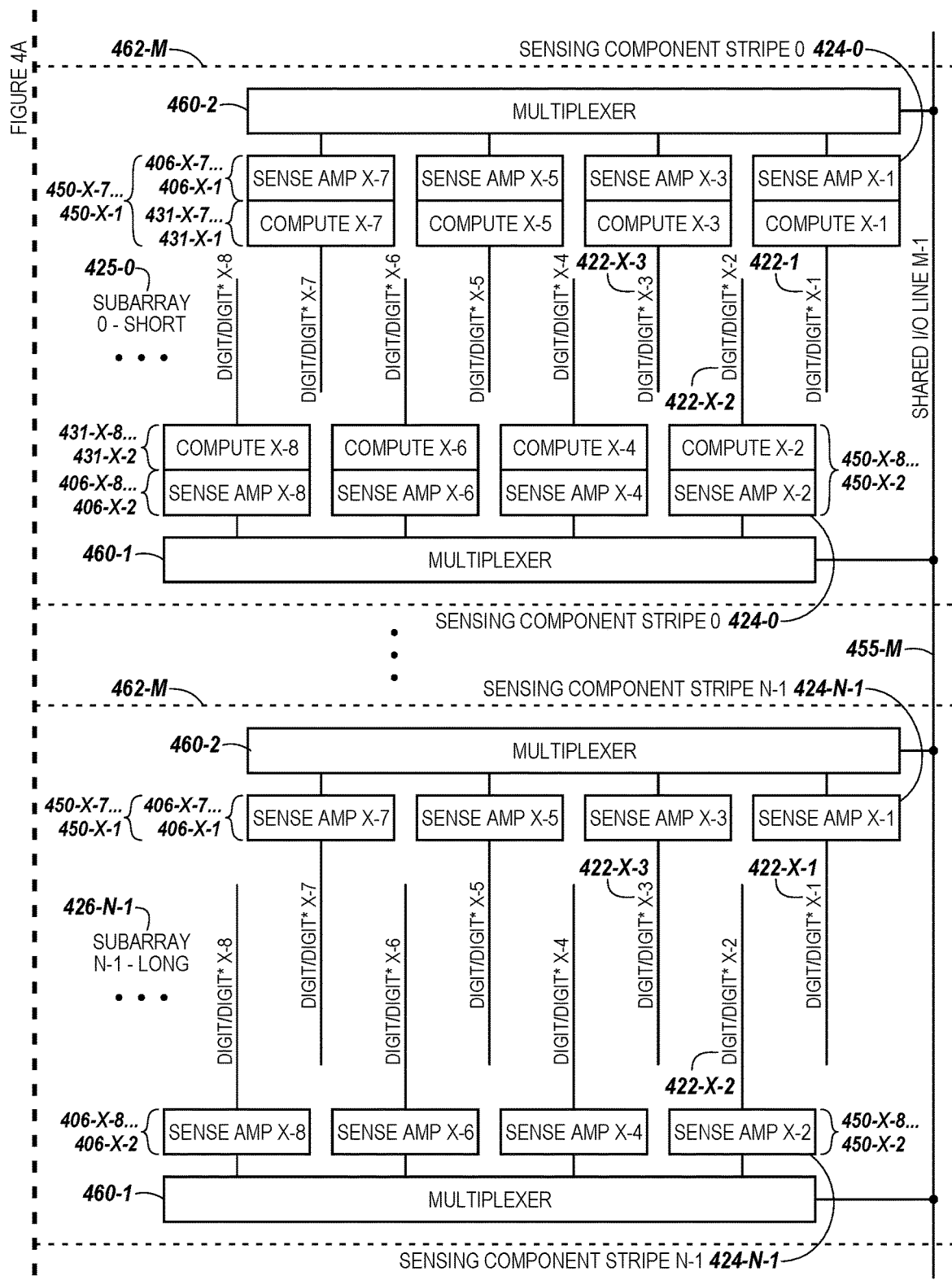

The cells of the memory array 230 may be arranged in rows coupled by access (word) lines 204-X (Row X), 204-Y (Row Y), etc., and columns coupled by pairs of complementary sense lines, e.g., digit lines DIGIT(D) and DIGIT (D)_ shown in FIG. 2 and DIGIT_0 and DIGIT_0* shown in FIGS. 3 and 4A-4B. The individual sense lines corresponding to each pair of complementary sense lines may also be referred to as digit lines 205-1 for DIGIT (D) and 205-2 for DIGIT (D)_, respectively, or corresponding reference numbers in FIGS. 3 and 4A-4B. Although only one pair of complementary digit lines are shown in FIG. 2, embodiments of the present disclosure are not so limited, and an array of memory cells may include additional columns of memory cells and digit lines, e.g., 4,096, 8,192, 16,384, etc.

Although rows and columns are illustrated as orthogonally oriented in a plane, embodiments are not so limited. For example, the rows and columns may be oriented relative to each other in any feasible three-dimensional configuration. The rows and columns may be oriented at any angle relative to each other, may be oriented in a substantially horizontal plane or a substantially vertical plane, and/or may be oriented in a folded topology, among other possible three-dimensional configurations.

Memory cells may be coupled to different digit lines and word lines. For example, a first source/drain region of a transistor 202-1 may be coupled to digit line 205-1 (D), a second source/drain region of transistor 202-1 may be coupled to capacitor 203-1, and a gate of a transistor 202-1 may be coupled to word line 204-Y. A first source/drain region of a transistor 202-2 may be coupled to digit line 205-2 (D)_, a second source/drain region of transistor 202-2 may be coupled to capacitor 203-2, and a gate of a transistor 202-2 may be coupled to word line 204-X. A cell plate, as shown in FIG. 2, may be coupled to each of capacitors 203-1 and 203-2. The cell plate may be a common node to which a reference voltage, e.g., ground, may be applied in various memory array configurations.

The memory array 230 is configured to couple to sensing circuitry 250 in accordance with a number of embodiments of the present disclosure. In this embodiment, the sensing circuitry 250 comprises a sense amplifier 206 and a compute component 231 corresponding to respective columns of memory cells, e.g., coupled to respective pairs of complementary digit lines in a short digit line subarray. The sense amplifier 206 may be coupled to the pair of complementary digit lines 205-1 and 205-2. The compute component 231 may be coupled to the sense amplifier 206 via pass gates 207-1 and 207-2. The gates of the pass gates 207-1 and 207-2 may be coupled to operation selection logic 213.

The operation selection logic 213 may be configured to include pass gate logic for controlling pass gates that couple the pair of complementary digit lines un-transposed between the sense amplifier 206 and the compute component 231 and swap gate logic for controlling swap gates that couple the pair of complementary digit lines transposed between the sense amplifier 206 and the compute component 231. The operation selection logic 213 may also be coupled to the pair of complementary digit lines 205-1 and 205-2. The operation selection logic 213 may be configured to control continuity of pass gates 207-1 and 207-2 based on a selected operation.

The sense amplifier 206 may be operated to determine a data value, e.g., logic state, stored in a selected memory cell. The sense amplifier 206 may comprise a cross coupled latch, which may be referred to herein as a primary latch. In the example illustrated in FIG. 2, the circuitry corresponding to sense amplifier 206 comprises a latch 215 including four transistors coupled to a pair of complementary digit lines D 205-1 and (D)_205-2. However, embodiments are not limited to this example. The latch 215 may be a cross coupled latch. For example, gates of a pair of transistors, such as n-channel transistors, e.g., NMOS transistors, 227-1 and 227-2 are cross coupled with the gates of another pair of transistors, such as p-channel transistors, e.g., PMOS transistors, 229-1 and 229-2. The cross coupled latch 215 comprising transistors 227-1, 227-2, 229-1, and 229-2 may be referred to as a primary latch.

In operation, when a memory cell is being sensed, e.g., read, the voltage on one of the digit lines 205-1 (D) or 205-2 (D)_ will be slightly greater than the voltage on the other one of digit lines 205-1 (D) or 205-2 (D)_. An ACT signal and an RNL* signal, for example, may be driven low to enable, e.g., fire, the sense amplifier 206. The digit lines 205-1 (D) or 205-2 (D)_ having the lower voltage will turn on one of the PMOS transistor 229-1 or 229-2 to a greater extent than the other of PMOS transistor 229-1 or 229-2, thereby driving high the digit line 205-1 (D) or 205-2 (D)_ having the higher voltage to a greater extent than the other digit line 205-1 (D) or 205-2 (D)_ is driven high.

Similarly, the digit line 205-1 (D) or 205-2 (D)_ having the higher voltage will turn on one of the NMOS transistor 227-1 or 227-2 to a greater extent than the other of the NMOS transistor 227-1 or 227-2, thereby driving low the digit line 205-1 (D) or 205-2 (D)_ having the lower voltage to a greater extent than the other digit line 205-1 (D) or 205-2 (D)_ is driven low. As a result, after a short delay, the digit line 205-1 (D) or 205-2 (D)_ having the slightly greater voltage is driven to the voltage of the supply voltage $V_{CC}$ through a source transistor, and the other digit line 205-1 (D) or 205-2 (D)_ is driven to the voltage of the reference voltage, e.g., ground, through a sink transistor. Therefore, the cross coupled NMOS transistors 227-1 and 227-2 and PMOS transistors 229-1 and 229-2 serve as a sense amplifier pair, which amplify the differential voltage on the digit lines 205-1 (D) and 205-2 (D)_ and operate to latch a data value sensed from the selected memory cell. As used herein, the cross coupled latch of sense amplifier 206 may be referred to as the primary latch 215.

Embodiments are not limited to the sense amplifier 206 configuration illustrated in FIG. 2. As an example, the sense amplifier 206 may be a current-mode sense amplifier and a single-ended sense amplifier, e.g., sense amplifier coupled to one digit line. Also, embodiments of the present disclosure are not limited to a folded digit line architecture such as that shown in FIG. 2.

The sense amplifier 206 may, in conjunction with the compute component 231, be operated to perform various operations using data from an array as input. In a number of embodiments, the result of an operation may be stored back to the array without transferring the data via a digit line address access, e.g., without firing a column decode signal such that data is transferred to circuitry external from the array and sensing circuitry via local I/O lines. As such, a number of embodiments of the present disclosure may enable performing operations and compute functions associated therewith using less power than various previous approaches. Additionally, since a number of embodiments reduce or eliminate transferring data across local and global I/O lines in order to perform the operations and associated compute functions, e.g., transferring data between memory and a discrete processor, a number of embodiments may enable an increased, e.g., faster, processing capability as compared to previous approaches.

The sense amplifier 206 may further include equilibration circuitry 214, which may be configured to equilibrate the digit lines 205-1 (D) and 205-2 (D)_. In this example, the equilibration circuitry 214 comprises a transistor 224 coupled between digit lines 205-1 (D) and 205-2 (D)_. The equilibration circuitry 214 also comprises transistors 225-1 and 225-2 each having a first source/drain region coupled to an equilibration voltage, e.g., $V_{DD}/2$, where $V_{DD}$ is a supply voltage associated with the array. A second source/drain region of transistor 225-1 may be coupled to digit line 205-1 (D), and a second source/drain region of transistor 225-2 may be coupled to digit line 205-2 (D)_. Gates of transistors 224, 225-1, and 225-2 may be coupled together, and to an equilibration (EQ) control signal line 234. As such, activating EQ enables the transistors 224, 225-1, and 225-2, which effectively shorts digit lines 205-1 (D) and 205-2 (D)_ together and to the equilibration voltage, e.g., $V_{CC}/2$.

Although FIG. 2 shows sense amplifier 206 comprising the equilibration circuitry 214, embodiments are not so limited, and the equilibration circuitry 214 may be implemented discretely from the sense amplifier 206, implemented in a different configuration than that shown in FIG. 2, or not implemented at all.

As described further below, in a number of embodiments, the sensing circuitry 250, e.g., sense amplifier 206 and compute component 231, may be operated to perform a selected operation and initially store the result in one of the sense amplifier 206 or the compute component 231 without transferring data from the sensing circuitry via a local or global I/O line, e.g., without performing a sense line address access via activation of a column decode signal, for instance.

Performance of various types of operations may be implemented. For example, Boolean operations, e.g., Boolean logical functions involving data values, are used in many higher level applications. Consequently, speed and power efficiencies that may be realized with improved performance of the operations may provide improved speed and/or power efficiencies for these applications.

As shown in FIG. 2, the compute component 231 may also comprise a latch, which may be referred to herein as a secondary latch 264. The secondary latch 264 may be configured and operated in a manner similar to that described above with respect to the primary latch 215, with the exception that the pair of cross coupled p-channel transistors, e.g., PMOS transistors, included in the secondary latch may have their respective sources coupled to a supply voltage, e.g., $V_{DD}$, and the pair of cross coupled n-channel transistors, e.g., NMOS transistors, of the secondary latch may have their respective sources selectively coupled to a reference voltage, e.g., ground, such that the secondary latch is continuously enabled. The configuration of the compute component 231 is not limited to that shown in FIG. 2, and various other embodiments are feasible.

In various embodiments, connection circuitry 232-1 may, for example, be coupled at 217-1 and connection circuitry 232-2 may be coupled at 217-1 to the primary latch 215 for movement of sensed and/or stored data values. The sensed and/or stored data values may be moved to a selected memory cell in a particular row and/or column of another subarray via a shared I/O line, as described herein, and/or directly to the selected memory cell in the particular row and/or column of the other subarray via connection circuitry 232-1 and 232-2. Although FIG. 2 shows connection circuitry 232-1 and 232-2 to be coupled at 217-1 and 217-2, respectively, of the primary latch 215, embodiments are not so limited. For example, connection circuitry 232-1 and 232-2 may, for example, be coupled to the secondary latch 264 for movement of the sensed and/or stored data values, among other possible locations for coupling connection circuitry 232-1 and 232-2.

In various embodiments, connection circuitry, e.g., 232-1 and 232-2, may be configured to connect sensing circuitry coupled to a particular column in a first subarray to a number of rows in a corresponding column in a second subarray, e.g., which may be an adjacent subarray and/or separated by a number of other subarrays. As such, the connection circuitry may be configured to move, e.g., copy, transfer, and/or transport, a data value, e.g., from a selected row and the particular column, to a selected row and the corresponding column in the second subarray, e.g., the data value may be copied to a selected memory cell therein, for performance of an operation in a short digit line subarray and/or for storage of the data value in a long digit line subarray. In some embodiments, the movement of the data value may be directed by the controller 140 executing a set of instructions to store the data value in the sensing circuitry 250, e.g., the sense amplifier 206 and/or the coupled compute component 231, and the controller 140 may select a particular row and/or a particular memory cell intersected by the corresponding column in the second subarray to receive the data value by movement, e.g., copying, transferring, and/or transporting, of the data value.

FIG. 3 is a schematic diagram illustrating circuitry for data movement in a memory device in accordance with a number of embodiments of the present disclosure. FIG. 3 shows eight sense amplifiers, e.g., sense amplifiers 0, 1, ..., 7 shown at 306-0, 306-1, ..., 306-7, respectively, each coupled to a respective pair of complementary sense lines, e.g., digit lines 305-1 and 305-2. FIG. 3 also shows eight compute components, e.g., compute components 0, 1, ..., 7 shown at 331-0, 331-1, ..., 331-7, each coupled to a respective sense amplifier, e.g., as shown for sense amplifier 0 at 306-0, via respective pass gates 307-1 and 307-2 and digit lines 305-1 and 305-2. For example, the pass gates may be connected as shown in FIG. 2 and may be controlled by an operation selection signal, Pass. An output of the selection logic may be coupled to the gates of the pass gates 307-1 and 307-2 and digit lines 305-1 and 305-2. Corresponding pairs of the sense amplifiers and compute components may contribute to formation of the sensing circuitry indicated at 350-0, 350-1, . . . , 350-7.

Data values present on the pair of complementary digit lines 305-1 and 305-2 may be loaded into the compute component 331-0 as described in connection with FIG. 2. For example, when the pass gates 307-1 and 307-2 are enabled, data values on the pair of complementary digit lines 305-1 and 305-2 may be passed from the sense amplifiers to the compute component, e.g., 306-0 to 331-0. The data values on the pair of complementary digit lines 305-1 and 305-2 may be the data value stored in the sense amplifier 306-0 when the sense amplifier is fired.

The sense amplifiers 306-0, 306-1, . . . , 306-7 in FIG. 3 may each correspond to sense amplifier 206 shown in FIG. 2. The compute components 331-0, 331-1, . . . , 331-7 shown in FIG. 3 may each correspond to compute component 231 shown in FIG. 2. The size of the sense amplifiers 306 and compute components 331 illustrated in FIG. 3 is shown for purposes of clarity. However, as shown in FIG. 2, the sense amplifiers 306 and/or compute components 331 may be formed to fit within, e.g., on pitch with, corresponding complementary digit lines 305-1 and 305-2. A combination of one sense amplifier with one compute component may contribute to the sensing circuitry, e.g., 350-0, 350-1, . . . , 350-7, of a portion of a DRAM memory subarray 325, e.g., a short digit line subarray as shown at 125 in FIGS. 1B and 1C, configured to couple to an I/O line 355 shared by a number of subarrays and/or partitions, as described herein. The paired combinations of the sense amplifiers 306-0, 306-1, . . . , 306-7 and the compute components 331-0, 331-1, . . . , 331-7, shown in FIG. 3, may be included in a sensing component stripe, as shown at 124 in FIGS. 1B and 1C and at 424 in FIGS. 4A and 4B.

The configurations of embodiments illustrated in FIG. 3 are shown for purposes of clarity and are not limited to these configurations. For instance, the configuration illustrated in FIG. 3 for the sense amplifiers 306-0, 306-1, . . . , 306-7 in combination with the compute components 331-0, 331-1, . . . , 331-7 and the shared I/O line 355 is not limited to half the combination of the sense amplifiers 306-0, 306-1, . . . , 306-7 with the compute components 331-0, 331-1, . . . , 331-7 of the sensing circuitry being formed above the columns 322 of memory cells (not shown) and half being formed below the columns 322 of memory cells. Nor are the number of such combinations of the sense amplifiers with the compute components forming the sensing circuitry configured to couple to a shared I/O line limited to eight. In addition, the configuration of the shared I/O line 355 is not limited to being split into two for separately coupling each of the two sets of complementary digit lines 305-1 and 305-2, nor is the positioning of the shared I/O line 355 limited to being in the middle of the combination of the sense amplifiers and the compute components forming the sensing circuitry, e.g., rather than being at either end of the combination of the sense amplifiers and the compute components.

The circuitry illustrated in FIG. 3 also shows column select circuitry 358-1 and 358-2 that is configured to implement data movement operations with respect to particular columns 322 of a subarray 325, the complementary digit lines 305-1 and 305-2 associated therewith, and the shared I/O line 355, e.g., as directed by the controller 140 shown in FIGS. 1A-1C. For example, column select circuitry 358-1 has select lines 0, 2, 4, and 6 that are configured to couple with corresponding columns, such as column 0, column 2, column 4, and column 6. Column select circuitry 358-2 has select lines 1, 3, 5, and 7 that are configured to couple with corresponding columns, such as column 1, column 3, column 5, and column 7. The column select circuitry 358 illustrated in connection with FIG. 3 may, in various embodiments, represent at least a portion of the functionality embodied by and contained in the multiplexers 460 illustrated in connection with FIGS. 4A and 4B.

Controller 140 may be coupled to column select circuitry 358 to control select lines, e.g., select line 0, to access data values stored in the sense amplifiers, compute components and/or present on the pair of complementary digit lines, e.g., 305-1 and 305-2 when selection transistors 359-1 and 359-2 are activated via signals from select line 0. Activating the selection transistors 359-1 and 359-2, e.g., as directed by the controller 140, enables coupling of sense amplifier 306-0, compute component 331-0, and/or complementary digit lines 305-1 and 305-2 of column 0 (322-0) to move data values on digit line 0 and digit line 0* to shared I/O line 355. For example, the moved data values may be data values from a particular row 319 stored (cached) in sense amplifier 306-0 and/or compute component 331-0 of the sensing component stripe for a short digit line subarray. Data values from each of columns 0 through 7 may similarly be selected by controller 140 activating the appropriate selection transistors.

Moreover, enabling, e.g., activating, the selection transistors, e.g., selection transistors 359-1 and 359-2, may enable a particular sense amplifier and/or compute component, e.g., 306-0 and/or 331-0, respectively, to be coupled with a shared I/O line 355 such that data values stored by an amplifier and/or compute component may be moved to, e.g., placed on, transferred, and/or transported to, the shared I/O line 355. In some embodiments, one column at a time is selected, e.g., column 322-0, to be coupled to a particular shared I/O line 355 to move, e.g., copy, transfer, and/or transport, the stored data values. In the example configuration of FIG. 3, the shared I/O line 355 is illustrated as a shared, differential I/O line pair, e.g., shared I/O line and shared I/O line*. Hence, selection of column 0 (322-0) could yield two data values, e.g., two bits with values of 0 and/or 1, from a row, e.g., row 319, and/or as stored in the sense amplifier and/or compute component associated with complementary digit lines 305-1 and 305-2. These data values could be input in parallel to each shared, differential I/O pair, e.g., shared I/O and shared I/O*, of the shared differential I/O line 355.

As described herein, a memory device, e.g., 120 in FIG. 1A, may be configured to couple to a host, e.g., 110, via a data bus, e.g., 156, and a control bus, e.g., 154. A bank 121 in the memory device, e.g., bank section 123 in FIG. 1B, may include a plurality of subarrays, e.g., 125-0 and 125-1 and 126-0, . . . , 126-N−1 in FIGS. 1B and 1C, of memory cells. The bank 121 may include sensing circuitry, e.g., 150 in FIG. 1A and corresponding reference numbers in FIGS. 2, 3, 4A, and 4B, coupled to the plurality of subarrays via a plurality of columns, e.g., 122 in FIG. 1B, of the memory cells. The sensing circuitry may include a sense amplifier and/or a compute component, e.g., 206 and 231, respectively, in FIG. 2, coupled to each of the columns.

The bank 121 may include a plurality of partitions, e.g., 128-0, 128-1, . . . , 128-M−1 in FIG. 1C, each including a respective grouping of the plurality of the subarrays. A controller 140 coupled to the bank may be configured to direct a first data movement from a first subarray to a second subarray in a first partition, e.g., from subarray 125-0 to subarray 126-0 in partition 128-0 in FIG. 1C, in parallel with a second data movement from a first subarray to a second subarray in a second partition, e.g., from subarray 125-2 to subarray 126-2 (not shown) in partition 128-1 in FIG. 1C.

In various embodiments, the sensing circuitry, e.g., 150 in FIG. 1A and corresponding reference numbers in FIGS. 2, 3, 4A, and 4B, of a first subarray may be coupled to the sensing circuitry of the second subarray within the first partition via the first portion of the shared I/O line 355 and the sensing circuitry of a first subarray within the second partition may be coupled to the sensing circuitry of the second subarray via the second portion of the shared I/O line 355. For example, as described in connection with FIGS. 3, 4A, and 4B, the sense amplifiers and/or compute components in a sensing component stripe 124 may be selectably coupled via the select circuitry 358 and/or the multiplexers 460. The controller 140 may be configured to direct a movement of a plurality of data values from, for example, a first subarray of a first partition to a plurality of memory cells in a second subarray of the first partition in parallel with a movement of a plurality of data values from a first subarray of a second partition to a plurality of memory cells in a second subarray of the second partition.

In some embodiments, the plurality of short digit line subarrays 125 may each be configured to include a same number of a plurality of rows, e.g., 119 in FIG. 1B and 319 in FIG. 3, of memory cells, the plurality of long digit line subarrays 126 may each be configured to include a same number of a plurality of rows, e.g., 118 in FIG. 1B, of memory cells, and/or the plurality of partitions may each be configured to include a same number of the plurality of the short and long digit line subarrays in each grouping. However, embodiments are not so limited. For example, in various embodiments, the number of rows in at least one subarray and/or the number of subarrays in at least one partition may differ from the other subarrays and/or partitions, depending upon the implementation.

The memory device 120 may include a shared I/O line, e.g., 155 in FIG. 1C, configured to be coupled to the sensing circuitry of the plurality of subarrays, such as to selectably implement movement of a data value from a memory cell in a first subarray to a memory cell in a second subarray. The memory device 120 may, in various embodiments, include a plurality of I/O lines shared by partitions, e.g., 355 in FIGS. 3 and 455-1, 455-2, . . . , 455-M in FIGS. 4A and 4B, such as to selectably implement parallel movement of a plurality of data values from a first to a second subarray, e.g., in the same partition or a different partition. The controller 140 may be configured to move (copy, transfer, and/or transport) the data values using the parallel partitioned data movement described herein, in response to a command, e.g., from the host 110, between subarrays in the bank of memory cells using a DRAM protocol and DRAM logical and electrical interfaces. For example, the controller 140 may be configured to use stored instructions for implementation of the DRAM protocol and DRAM logical and electrical interfaces.

As described herein, the array of memory cells may include an implementation of DRAM memory cells where the controller 140 is configured, in response to a command, to move data from the source location to the destination location via a shared I/O line. The source location may be in a first bank and the destination location may be in a second bank in the memory device and/or the source location may be in a first subarray of one bank in the memory device and the destination location may be in a second subarray of the same bank. The first subarray and the second subarray may be in the same partition of the bank or the subarrays may be in different partitions of the bank.

A memory device 120 may include a plurality of subarrays of memory cells. In various embodiments, the plurality of subarrays includes a first subset, e.g., short digit line subarrays 125 in FIGS. 1B and 1C and at corresponding reference numbers in FIGS. 3, 4A, and 4B, of the respective plurality of subarrays and a second subset, e.g., long digit line subarrays 126 in FIGS. 1B and 1C and at corresponding reference numbers in FIGS. 4A and 4B, of the respective plurality of subarrays. The memory device may include first sensing circuitry, e.g., 150 in FIG. 1A and at corresponding reference numbers in FIGS. 2, 3, 4A, and 4B, coupled to the first subset 125, the first sensing circuitry including a sense amplifier and a compute component, e.g., 206 and 231, respectively, in FIG. 2 and at corresponding reference numbers in FIGS. 3, 4A, and 4B. The first subset 125 may be configured, e.g., as a number of cache subarrays, to perform a sequential plurality of operations in-memory on data moved from the second subset 126.

The memory device 120 also may include a controller, e.g., 140 in FIGS. 1A-1C, configured to direct a first movement of a number of data values, e.g., an initial data value and/or additional data values, from a subarray, e.g., one or more subarrays, in the second subset, e.g., from long digit line (storage) subarray 126-0 in FIGS. 1B and 1C and at corresponding reference numbers in FIGS. 4A and 4B, to a subarray in the first subset, e.g., to short digit line (cache) subarray 125-0 in FIGS. 1B and 1C and at corresponding reference numbers in FIGS. 3, 4A, and 4B. The controller 140 also may be configured to direct performance of the sequential plurality of operations on the number of data values by the sense amplifier 206 and/or the compute component 231 of the first sensing circuitry coupled to the first subset 125.

The controller 140 may also be configured to direct a second movement of a data value from the subarray in the first subset, e.g., from short digit line (cache) subarray 125-0 in FIGS. 1B and 1C and at corresponding reference numbers in FIGS. 3, 4A, and 4B, to a subarray in the second subset, e.g., to long digit line (storage) subarray 126-0 in FIGS. 1B and 1C and at corresponding reference numbers in FIGS. 4A and 4B. For example, the controller 140 may be configured to direct performance of the second movement of the data value, which is a result of the sequential plurality of operations performed on the number of data values moved from the subarray in the second subset. For example, the sequential plurality of operations may be performed by the sense amplifier and the compute component of a cache subarray in the first subset without movement of a result of the sequential plurality of operations to the storage subarray of the second subset prior to completion of a last of the sequential plurality of operations by the sense amplifier and the compute component of the cache subarray.

In some embodiments, as described herein, the controller 140 may be configured to direct the second movement of the result data value on which the sequential plurality of operations has been performed from the cache subarray back to storage in the original subarray in the second subset from which the number of data values were sent in the first movement and/or in which the number of data values were previously stored. However, embodiments are not so limited. For example, in various embodiments described herein, the controller 140 also may be configured to direct the second movement of the result data value on which the sequential plurality of operations has been performed from a particular location, e.g., the sensing circuitry and/or a particular row of the cache subarray, e.g., 125-0, to a number of alternative destination locations. The alternative destination locations may include a different row in cache subarray 125-0 and/or a particular row in a different cache subarray, e.g., 125-1, and/or a different row in the original storage subarray, e.g., 126-0, and/or a particular row in a different storage subarray, e.g., 126-1. The alternative destination locations may, in various embodiments, further include a particular register and/or row therein of the number of bank registers 158 and/or the number of vector registers 159 associated with, e.g., selectably coupled to, the controller 140.

In some embodiments, the sensing circuitry 150 may be coupled to a first subarray 125 in the first subset via a column 122 of the memory cells, the sensing circuitry including the sense amplifier 206 and the compute component 231 coupled to the column. A number of memory cells in a column of the first subarray 125 in the first subset may, in some embodiments, be at most half of a number of memory cells in a column of a first subarray 126 in the second subset. Alternatively or in addition, a first physical length of a sense line, e.g., of a pair of complementary sense lines, of the first subarray 125 in the first subset may, in some embodiments, be at most half of a second physical length of a sense of a first subarray 126 in the second subset. Alternatively or in addition, a first physical length of a column of the first subarray 125 in the first subset may, in some embodiments, be at most half of a second physical length of a column of a first subarray 126 in the second subset. The comparative numbers of memory cells in and/or physical lengths of the columns of the short digit line subarrays versus the long digit line subarrays are represented by the span of the respective rows 119 and 118 in FIG. 1B and by the comparative lengths of the subarrays and/or digit lines in FIGS. 1C, 4A, and 4B.

In various embodiments, results of each of the respective sequential plurality of operations may be stored by a subarray in the first subset, e.g., short digit line subarray 125-0 as shown in and described in connection with FIG. 1C, until the performance of the sequential plurality of operations is completed in order to compute a result of a last of the sequential plurality of operations. The results of each of the respective sequential plurality of operations may be stored by first sensing circuitry 150, e.g., sensing circuitry of sensing component stripe 124-0, coupled to the first subset until the performance of the sequential plurality of operations is completed in order to compute the result of the last of the sequential plurality of operations.

The memory device 120 may include sensing circuitry 150 coupled to the second subset of the subarrays, e.g., long digit line subarray 126-0 as shown in and described in connection with FIG. 1C. In some embodiments, the sensing circuitry coupled to the second subset may include a sense amplifier but no compute component, e.g., as shown at 206 and 231, respectively, and described in connection with FIG. 2. Although sensing circuitry for the second subset may, in some embodiments, include both the sense amplifier and compute component, to distinguish the embodiments in which the compute component is not included, that embodiment is termed the second sensing circuitry for the second subset and the sensing circuitry for the first subset, which includes the compute component, is termed the first sensing circuitry. As such, the second subset of subarrays may be used to store a number of data values on which a sequential plurality of operations may be performed by the first sensing circuitry. For example, a sensed number of data values may be stored in the second sensing circuitry prior to the first movement of the data value to the first sensing circuitry of the first subset of subarrays.

The first sensing circuitry and the second sensing circuitry of the memory device may be formed on pitch with sense lines of the respective first and second subsets of the plurality of subarrays, e.g., as shown in FIGS. 1B, 1C, 3, 4A, and 4B. In some embodiments, column select circuitry, e.g., 358-1 and 358-2 in FIG. 3, may be used to selectably sense data in a particular column, e.g., 322-0, of memory cells of a subarray 325 in either of the first and second subsets by being selectably coupled to at least a sense amplifier coupled to a respective sense line, e.g., 305-1 and 305-2, for the particular column.

The second subset of the subarrays, e.g., the memory cells of the long digit line subarrays 126, may be used to store a data value on which the operation may be performed by the first sensing circuitry prior to the first movement of the data value to the first subset of the subarrays. In addition, the second subset of the subarrays, e.g., the same or different memory cells of the same or different long digit line subarrays 126, may be used to store a result data value, on which the sequential plurality of operations has been performed by the first sensing circuitry, subsequent to the second movement of the data value. Alternatively or in addition, a subarray in the first subset, e.g., a short digit line subarray 125, may store a result data value, on which the sequential plurality of operations has been performed by the first sensing circuitry, subsequent to a second movement of the data value. For example, instead of or in addition to a result data value being moved from sensing component stripe 124-0 of short digit line subarray 125-0 to a memory cell in a row 118 of long digit line subarray 126-0, e.g., via sensing component stripe 124-1, the result data value may be moved from the sensing component stripe 124-0 of short digit line subarray 125-0 to a memory cell in a row 119 of a short digit line subarray, e.g., one or more rows 119 in one or more of short digit line subarrays 125-0, 125-1, . . . , 125-N−1.

The controller 140 described herein may be configured to direct the first movement of the number of data values from a selected row in a first subarray in the second subset, e.g., a long digit line subarray 126, to a selected row in a first subarray in the first subset, e.g., a long digit line subarray 126. The controller 140 described herein may be further configured to direct a second movement of the data value that is a result of the performance of the sequential plurality of operations from the first subarray in the first subset, e.g., a long digit line subarray 126, to a selected row in the first subarray in the second subset. For example, in some embodiments, the data value may be moved from a selected row (or a selected memory cell) of the second subarray to a selected row (or a selected memory cell) of the first subarray, a sequential plurality of operations may be performed on the data value by the sensing circuitry of the first subarray, and then the result data value may be moved, e.g., from the sensing circuitry and/or a row of the first subarray, back to the same selected row (or the same selected memory cell) of the first subarray of the second subset after the sequential plurality of operations has been performed thereon.

Alternatively or in addition, the controller may be further configured to direct a second movement of a data value that is a result of the performance of the sequential plurality of operations, e.g., from the sensing circuitry and/or a row of the first subarray, to a second subarray in the second subset that is different from the first subarray from which the number of data values were moved by the first movement. For example, the number of data values may have been moved from one or more rows of long digit line subarray 126-0 by the first movement and the result data value may be moved by the second movement to any of long digit line subarrays 126-1, 126-2, . . . , 126-N−1. Alternatively or in addition, the controller may be further configured to direct the second movement to a number of the bank registers 158 and/or the vector registers 159 shown in and described in connection with FIG. 1C.

The memory device 120 may include a controller, e.g., 140 in FIGS. 1A-1C. The controller 140 may be coupled to a bank 121 of the memory device. The controller may be configured to receive a set of instructions from a host 110 to perform a sequential plurality of data processing operation, and pass command instructions to execute the sequential plurality of data processing operation in the bank of the memory device 120.

The memory device 120 may, in some embodiments, include connection circuitry configured to connect sensing circuitry, e.g., as shown at 232-1 and 232-2 and described in connection with FIG. 2, coupled to a particular column in a first subarray in the first subset to a number of rows in a corresponding column in a first subarray in the second subset. For example, the connection circuitry may be configured to move the data value to a selected row, or rows, and the corresponding column in the first subarray in the first subset, e.g., the short digit line subarrays 125, for performance of the sequential plurality of operations, e.g., in the respective sensing component stripe.

Movement of a data value, e.g., via a shared I/O line and/or connection circuitry, may be directed by the controller 140 executing a set of instructions for movement of the data value from the first subarray in the second subset, e.g., the long digit line subarrays 126, to the selected row, or rows, and the corresponding column in the first subarray in the first subset. The selected row, or rows, and the corresponding column in the first subarray in the first subset may be configured to receive, e.g., cache, the data value. The controller 140 may then direct the performance of the sequential plurality of operations on the data value in the sensing circuitry of the first subarray in the first subset.

The controller 140 may be further configured to direct movement, e.g., via the shared I/O line and/or the connection circuitry, of the data value on which the sequential plurality of operations has been performed from the selected row, or rows, and the corresponding column in the first subarray in the first subset, e.g., the short digit line subarrays 125, to a number of rows in the corresponding column in the first subarray in the second subset, e.g., the long digit line subarrays 126. In various embodiments, the rows, columns, and/or subarrays to which the data values are moved after the sequential plurality of operations has been performed thereon may differ from the rows, columns, and/or subarrays from which the data values were sent from the long digit line subarray to the short digit line subarray. For example, the data values may be moved to different rows, columns, and/or subarrays in one or more long digit line subarrays and/or to different rows, columns, and/or subarrays in one or more short digit line subarrays.

In some embodiments, when, for example, a controller executing a PIM command in a short digit line, e.g., cache, subarray attempts to access a row that is not cached in that short digit line subarray, the controller may move the data from the appropriate long digit line, e.g., storage, subarray into a number of rows of the cache subarray. When no rows are free and/or available for movement of the data values into the cache subarray, a row or rows of data values may be at least temporarily moved from, e.g., stored in another location, the cache subarray before loading, e.g., writing, the moved row or rows of data values. This may also involve moving the data values from the short digit line, e.g., cache, subarray into a long digit line, e.g., storage, subarray. In some embodiments, a data value may be directly retrieved from a long digit line subarray, e.g., when no operation is to be performed on the data value beforehand. Alternatively or in addition, a memory request to a row cached in the short digit line subarray may trigger a writeback, e.g., after an operation has been performed, to the long digit line subarray, from which the data value may subsequently be retrieved.

Attempted host, controller, and/or other accesses to data values stored in rows of long digit line subarray that have already been moved to, e.g., cached in, the short digit line subarrays may be redirected to use the version cached in the short digit line subarray, e.g., for consistency, efficiency, speed, etc. A particular short digit line, e.g., cache, subarray also may be associated with one or more, e.g., a set of, long digit line, e.g., storage, subarrays. For example, a same row from a storage subarray might be cached in a corresponding same row of a cache subarray across several corresponding groups, e.g., partitions, of partitioned subarrays. This may reduce complexity for the controller in determining source and destination locations for the data movements and/or may allow parallel data movement to be performed between the long digit line and short digit line subarrays in one or more of the partitions, as described herein.

In various embodiments, the memory device 120 may include isolation circuitry (not shown) configured to disconnect a first portion of a shared I/O line 355 corresponding to a first partition from a second portion of the same shared I/O line 355 corresponding to a second partition. The controller 140 may be configured to direct the isolation circuitry to disconnect the first portion and the second portion of the shared I/O line 355 during parallel movement of data values within the first partition and within the second partition. Disconnecting portions of the shared I/O line 355 may isolate the movement of data values within a first partition from the parallel movement of data values within a second partition.

FIGS. 4A and 4B represent another schematic diagram illustrating circuitry for data movement in a memory device in accordance with a number of embodiments of the present disclosure. As illustrated in FIGS. 1B and 1C and shown in more detail in FIGS. 4A and 4B, a bank section of a DRAM memory device may include a plurality of subarrays, which are indicated in FIGS. 4A and 4B at 425-0 as short digit line subarray 0 and at 426-N−1 as long digit line subarray N−1.

FIGS. 4A and 4B, which are to be considered as horizontally connected, illustrate that each subarray, e.g., short digit line subarray 425-0 and long digit line subarray 426-N−1 each partly shown in FIG. 4A and partly shown in FIG. 4B, may have at least a number of associated sense amplifiers 406-0, 406-1, . . . , 406-X−1. In addition, at least the short digit line subarray 425-0 may have compute components 431-0, 431-1, . . . , 431-X−1. Each subarray 425-0, . . . , 426-N−1 may, in some embodiments, have one or more associated sensing component stripes, e.g., 124-0, . . . , 124-N−1 in FIGS. 1B and 1C. According to embodiments described herein, each subarray 425-0, . . . , 426-N−1 may be split into portions 462-1 (shown in FIG. 4A), 462-2, . . . , 462-M (shown in FIG. 4B). The portions 462-1, . . . , 462-M may each respectively include a particular number, e.g., 2, 4, 8, 16, etc., of the sense amplifiers and/or compute components, e.g., sensing circuitry 150, along with the corresponding columns, e.g., 422-0, 422-1, . . . , 422-7, among columns 422-0, . . . ,

422-X-1 that may be selectably coupled to a given shared I/O line, e.g., 455-1, 455, 2, . . . , 455-M. At least for the short digit line subarray 425-0, corresponding pairs of the sense amplifiers and compute components may contribute to formation of the sensing circuitry indicated at 450-0, 450-1, . . . , 450-X-1 in FIGS. 4A and 4B.

In some embodiments, as shown in FIGS. 3, 4A, and 4B, the particular number of the sense amplifiers and/or compute components, along with the corresponding columns, that may be selectably coupled to a shared I/O line 455 (which may be a pair of shared differential lines) may be eight. The number of portions 462-1, 462-2, . . . , 462-M of the subarray may be the same as the number of shared I/O lines 455-1, 455, 2, . . . , 455-M that may be coupled to the subarray. The subarrays may be arranged according to various DRAM architectures for coupling shared I/O lines 455-1, 455, 2, . . . , 455-M between subarrays 425-0, . . . , 426-N-1.

For example, portion 462-1 of subarray 0 (425-0) in FIG. 4A may correspond to the portion of the subarray illustrated in FIG. 3. As such, sense amplifier 0 (406-0) and compute component 0 (431-0) may be coupled to column 422-0. As described herein, a column may be configured to include a pair of complementary digit lines referred to as digit line 0 and digit line 0*. However, alternative embodiments may include a single digit line 405-0 (sense line) for a single column of memory cells. Embodiments are not so limited.

As illustrated in FIGS. 1B and 1C and shown in more detail in FIGS. 4A and 4B, a sensing component stripe may, in various embodiments, extend from one end of a subarray to an opposite end of the subarray. For example, as shown for subarray 0 (425-0), sensing component stripe 0 (424-0), which is shown schematically above and below the DRAM columns in a folded sense line architecture, may include and extend from sense amplifier 0 (406-0) and compute component 0 (431-0) in portion 462-1 to sense amplifier X-1 (406-X-1) and compute component X-1 (431-X-1) in portion 462-M of subarray 0 (425-0).

As described in connection with FIG. 3, the configuration illustrated in FIGS. 4A and 4B for the sense amplifiers 406-0, 406-1, . . . , 406-X-1 in combination with the compute components 431-0, 431-1, . . . , 431-X-1 and shared I/O line 0 (455-1) through shared I/O line M-1 (455-M) is not limited to half the combination of the sense amplifiers with the compute components of the sensing circuitry (450) being formed above the columns of memory cells and half being formed below the columns 422-0, 422-1, . . . , 422-X-1 of memory cells in a folded DRAM architecture. For example, in various embodiments, a sensing component stripe 424 for a particular short digit line subarray 425 may be formed with any number of the sense amplifiers and compute components of the sensing component stripe being formed above and/or below the columns of memory cells. Similarly, a sensing component stripe 424 for a particular long digit line subarray 426 may, in various embodiments, be formed with any number of the sense amplifiers of the sensing component stripe being formed above and/or below the columns of memory cells. Accordingly, in some embodiments as illustrated in FIGS. 1B and 1C, all of the sense amplifiers and/or compute components of the sensing circuitry and corresponding sensing component stripes may be formed above or below the columns of memory cells.

As described in connection with FIG. 3, each subarray may have column select circuitry, e.g., 358, that is configured to implement data movement operations with respect to particular columns 422 of a subarray, such as subarray 425-0 and the complementary digit lines thereof, coupling stored data values from the sense amplifiers 406 and/or compute components 431 to given shared I/O lines 455-1, . . . , 455-M, e.g., complementary shared I/O lines 355 in FIG. 3. For example, the controller 140 may direct that data values of memory cells in a particular row, e.g., selected from rows 118 in FIG. 1B, of long digit line subarray 426-N-1 be sensed and moved to a same or different numbered row of one or more short digit line subarrays 425 in a same or different numbered column. For example, in some embodiments, the data values may be moved from a portion of a first subarray to a different portion of a second subarray, e.g., not necessarily from portion 462-1 of long digit line subarray N-1 to portion 462-1 of short digit line subarray 0. In some embodiments data values may be moved from a column in portion 462-1 to a column in portion 462-M using shifting techniques.

The column select circuitry, e.g., 358 in FIG. 3, may direct movement, e.g., sequential movement, for each of the eight columns, e.g., digit/digit*, in the portion of the subarray, e.g., portion 462-1 of short digit line subarray 425-0 or long digit line subarray 426-N-1, such that the sense amplifiers and/or compute components of the sensing component stripe 424-0 for that respective portion may store (cache) and move all data values to the shared I/O line in a particular order, e.g., in an order in which the columns were sensed. With complementary digit lines, digit/digit*, and complementary shared I/O lines 355, for each of eight columns, there may be 16 data values, e.g., bits, sequenced to the shared I/O line from one portion of the subarray such that one data value, e.g., bit, is input to each of the complementary shared I/O lines at a time from each of the sense amplifiers and/or compute components.

As such, with 2048 portions of subarrays each having eight columns, e.g., subarray portion 462-1 of each of subarrays 425-0, . . . , 426-N-1, and each configured to couple to a different shared I/O line, e.g., 455-1 through 455-M, 2048 data values, e.g., bits, could be moved to the plurality of shared I/O lines at substantially the same point in time, e.g., in parallel. Accordingly, the plurality of shared I/O lines might be, for example, at least a thousand bits wide, e.g., 2048 bits wide, such as to increase the speed, rate, and/or efficiency of data movement in a DRAM implementation, e.g., relative to a 64 bit wide data path.

As illustrated in FIGS. 4A and 4B, for each subarray, e.g., short digit line subarray 425-0 and long digit line subarray 426-N-1, one or more multiplexers 460-1 and 460-2 may be coupled to the sense amplifiers and/or compute components of each portion 462-1, 462-2, . . . , 462-M of the sensing component stripe 424 for the subarray. The multiplexers 460 illustrated in connection with FIGS. 4A and 4B may, in various embodiments, be inclusive of at least the functionality embodied by and contained in the column select circuitry 358 illustrated in connection with FIG. 3. The multiplexers 460-1 and 460-2 may be configured to access, select, receive, coordinate, combine, and move, e.g., copy, transfer, and/or transport, the data values, e.g., bits, stored by the number of selected sense amplifiers and/or compute components in a portion, e.g., portion 462-1, of the subarray to the shared I/O line, e.g., shared I/O line 455-1. The multiplexers may be formed between the sense amplifiers and/or compute components and the shared I/O line. As such, a shared I/O line, as described herein, may be configured to couple a source location and a destination location between pairs of bank section subarrays for improved data movement.

As described herein, a controller 140 may be coupled to a bank, e.g., 121, of a memory device, e.g., 120, to execute a command to move data in the bank from a source location, e.g., long digit line subarray 426-N−1, to a destination location, e.g., short digit line subarray 425-0, and vice versa, e.g., subsequent to performance of an operation thereon. A bank section may, in various embodiments, include a plurality of subarrays of memory cells in the bank section, e.g., subarrays 125-0 through 126-N−1 and 425-0 through 426-N−1. The bank section may, in various embodiments, further include sensing circuitry, e.g., 150, coupled to the plurality of subarrays via a plurality of columns, e.g., 322-0, 422-0, and 422-1, of the memory cells. The sensing circuitry may include a sense amplifier and/or a compute component, e.g., 206 and 231, respectively, in FIG. 2 and at corresponding reference numbers in FIGS. 3, 4A, and 4B, coupled to each of the columns and configured to implement the command to move the data.

The bank section may, in various embodiments, further include a shared I/O line, e.g., 155, 355, 455-1, and 455-M, to couple the source location and the destination location to move the data. In addition, the controller 140 may be configured to direct the plurality of subarrays and the sensing circuitry to perform a data write operation on the moved data to the destination location in the bank section, e.g., a selected memory cell in a particular row and/or column of a different selected subarray.

In various embodiments, the apparatus may include a sensing component stripe, e.g., 124 and 424, including a number of sense amplifiers and/or compute components that corresponds to a number of columns of the memory cells, e.g., where each column of memory cells is configured to couple to a sense amplifier and/or a compute component. The number of sensing component stripes in the bank section, e.g., 424-0 through 424-N−1, may correspond to a number of subarrays in the bank section, e.g., 425-0 through 426-N−1.

The number of sense amplifiers and/or compute components may be selectably, e.g., sequentially, coupled to the shared I/O line, e.g., as shown by column select circuitry at 358-1, 358-2, 359-1, and 359-2 in FIG. 3. The column select circuitry may be configured to selectably couple a shared I/O line to, for example, one or more of eight sense amplifiers and compute components in the source location, e.g., as shown in subarray 325 in FIG. 3 and subarray portions 462-1 through 462-M in FIGS. 4A and 4B. As such, the eight sense amplifiers and/or compute components in the source location may be sequentially coupled to the shared I/O line. According to some embodiments, a number of shared I/O lines formed in the array may correspond to a division of a number of columns in the array by the number, e.g., eight, of sense amplifiers and/or compute components that may be selectably coupled to each of the shared I/O lines. For example, when there are 16,384 columns in the array, e.g., bank section, or in each subarray thereof, and one sense amplifier and/or compute component per column, 16,384 columns divided by eight yields 2048 shared I/O lines.

A source sensing component stripe, e.g., 124 and 424, may include a number of sense amplifiers and/or compute components that may be selected and configured to move data values, e.g., a number of bits, sensed from a row of the source location in parallel to a plurality of shared I/O lines. For example, in response to commands for sequential sensing through the column select circuitry, the data values stored in memory cells of selected columns of a row of the subarray may be sensed by and stored (cached) in the sense amplifiers and/or compute components of the sensing component stripe until a number of data values, e.g., the number of bits, reaches the number of data values stored in the row and/or a threshold, e.g., the number of sense amplifiers and/or compute components in the sensing component stripe, and then move the data values via the plurality of shared I/O lines. In some embodiments, the threshold amount of data may correspond to the at least a thousand bit width of the plurality of shared I/O lines.

The controller 140 may, as described herein, be configured to move the data values from a selected row and a selected column in the source location to a selected row and a selected column in the destination location via the shared I/O line. In various embodiments, the data values may be moved in response to commands by the controller 140 coupled to a particular subarray 425-0, . . . , 426-N−1 and/or a particular sensing component stripe 424-0, . . . , 424-N−1 of the respective subarray. The data values in rows of a source, e.g., first, subarray may be moved sequentially to respective rows of a destination, e.g., second, subarray. In various embodiments, each subarray may include 128, 256, 512, 1024 rows, among other numbers of rows, depending upon whether a particular subarray is a short digit line subarray or a long digit line subarray. For example, the data values may, in some embodiments, be moved from a first row of the source subarray to a respective first row of the destination subarray, then moved from a second row of the source subarray to a respective second row of the destination subarray, followed by movement from a third row of the source subarray to a respective third row of the destination subarray, and so on until reaching, for example, a last row of the source subarray or a last row of the destination subarray. As described herein, the respective subarrays may be in the same partition or in different partitions.

In various embodiments, a selected row and a selected column in the source location, e.g., a first subarray, input to the controller 140 may be different from a selected row and a selected row and a selected column in the destination location, e.g., a second subarray. As such, a location of the data in memory cells of the selected row and the selected column in the source subarray may be different from a location of the data moved to memory cells of the selected row and the selected column in the destination subarray. For example, the source location may be a particular row and digit lines of portion 462-1 of long digit line subarray 426-N−1 in FIG. 4A and the destination may be a different row and digit lines of portion 462-M in short digit line subarray 425-0 in FIG. 4B.

As described herein, a destination sensing component stripe, e.g., 124 and 424, may be the same as a source sensing component stripe. For example, a plurality of sense amplifiers and/or compute components may be selected and configured, e.g., depending on the command and/or directions from the controller 140, to selectably move sensed data to the coupled shared I/O line and selectably receive the data from one of a plurality of coupled shared I/O lines, e.g., to be moved to the destination location. Selection of sense amplifiers and/or compute components in the destination sensing component stripe may be performed using the column select circuitry, e.g., 358-1, 358-2, 359-1, and 359-2 in FIG. 3, and/or the multiplexers described herein, e.g., 460-1 and 460-2 in FIGS. 4A and 4B.

The controller 140 may, in some embodiments, be configured to write an amount of data, e.g., a number of data bits, selectably received by the plurality of selected sense amplifiers and/or compute components in the destination sensing component stripe to a selected row and columns of the destination location in the destination subarray. In some embodiments, the amount of data to write corresponds to the at least a thousand bit width of a plurality of shared I/O lines.

The destination sensing component stripe may, according to some embodiments, include a plurality of selected sense amplifiers and/or compute components configured to store received data values, e.g., bits, when an amount of received data values, e.g., the number of data bits), exceeds the at least a thousand bit width of the plurality of shared I/O lines. The controller 140 may, in various embodiments, be configured to write the stored data values, e.g., the number of data bits, to a selected row and columns in the destination location as a plurality of subsets. In some embodiments, the amount of data values of at least a first subset of the written data may correspond to the at least a thousand bit width of the plurality of shared I/O lines. According to some embodiments, the controller 140 may be configured to write the stored data values, e.g., the number of data bits, to the selected row and columns in the destination location as a single set, e.g., not as subsets of data values.

As described herein, the controller 140 may be coupled to a bank, e.g., 121, of a memory device, e.g., 120, to execute a command for parallel partitioned data movement in the bank. A bank in the memory device may include a plurality of partitions, e.g., 128-0, 128-1, . . . , 128-M–1 in FIG. 1C, each including a respective plurality of subarrays, e.g., 125-0 and 125-1 and 126-0 . . . , 126-N–1 as shown in FIGS. 1B and 1C and 425-0, . . . , 426-N–1 as shown in FIGS. 4A and 4B.

The bank may include sensing circuitry, e.g., 150 in FIG. 1A and 250 in FIG. 2, on pitch with sense lines of the plurality of subarrays and coupled to the plurality of subarrays via a plurality of sense lines, e.g., 205-1 and 205-2 in FIGS. 2, 305-1 and 305-2 and at corresponding reference numbers in FIGS. 3, 4A, and 4B. The sensing circuitry including a sense amplifier and/or a compute component, e.g., 206 and 231, respectively, in FIG. 2 and at corresponding reference numbers in FIGS. 3, 4A, and 4B, may be coupled to a sense line.

The bank also may include a plurality of shared I/O lines, e.g., 355 in FIGS. 3 and 455-1, 455-2, . . . , 455-M in FIGS. 4A and 4B, configured to be coupled to the sensing circuitry of the plurality of subarrays to selectably implement movement of a plurality of data values between subarrays, e.g., between short digit line subarray 125-0 and long digit line subarray 126-0 in FIG. 1C, of a first partition, e.g., partition 128-0 in FIG. 1C, in parallel with movement of a plurality of data values between subarrays, e.g., between short digit line subarray 125-2 and long digit line subarray 126-2 (not shown), of a second partition, e.g., partition 128-1. Isolation circuitry (not shown) may be configured to selectably connect or disconnect portions of an I/O line(s) shared by various partitions, e.g., the first 128-0 partition and the second partition 128-1.

A row may be selected, e.g., opened by the controller 140 via an appropriate select line, for the first sensing component stripe and the data values of the memory cells in the row may be sensed. After sensing, the first sensing component stripe may be coupled to the shared I/O line, along with coupling the second sensing component stripe to the same shared I/O line. The second sensing component stripe may still be in a pre-charge state, e.g., ready to accept data. After the data from the first sensing component stripe has been moved, e.g., driven, into the second sensing component stripe, the second sensing component stripe may fire, e.g., latch, to store the data into respective sense amplifiers and/or compute components. A row coupled to the second sensing component stripe may be opened, e.g., after latching the data, and the data that resides in the sense amplifiers and/or compute components may be written into the destination location of that row.

In some embodiments, 2048 shared I/O lines may be configured as a 2048 bit wide shared I/O line. According to some embodiments, a number of cycles for moving the data from a first row in the source location to a second row in the destination location may be determined by dividing a number of columns in the array intersected by a row of memory cells in the array by the 2048 bit width of the plurality of shared I/O lines. For example, an array, e.g., a bank, a bank section, or a subarray thereof, may have 16,384 columns, which may correspond to 16,384 data values in a row, which when divided by the 2048 bit width of the plurality of shared I/O lines intersecting the row may yield eight cycles, each separate cycle being at substantially the same point in time, e.g., in parallel, for movement of each 2048 bit fraction of the data in the row such that all 16,384 data bits in the row are moved after completion of the eight cycles. For example, only one of a plurality, e.g., a subset of eight, as shown in FIGS. 4A and 4B, of the sense amplifiers or the compute components in the sensing circuitry of the source location may be coupled at a time to a respective shared I/O line. In embodiments having 16,384 shared I/O lines, all 16,384 data bits may be moved in parallel.

Alternatively or in addition, a bandwidth for moving the data from a first row in the source location to a second row in the destination location may be determined by dividing the number of columns in the array intersected by the row of memory cells in the array by the 2048 bit width of the plurality of shared I/O lines and multiplying the result by a clock rate of the controller. In some embodiments, determining a number of data values in a row of the array may be based upon the plurality of sense (digit) lines in the array.

In some embodiments, the source location in the first subarray and the destination location in the second subarray may be in a single bank section of a memory device, e.g., as shown in FIGS. 1B-1C and FIGS. 4A-4B. Alternatively or in addition, the source location in the first subarray and the destination location in the second subarray may be in separate banks and bank sections of the memory device coupled to a plurality of shared I/O lines and/or connection circuitry, e.g., as shown at 232-1 and 232-2 and described in connection with FIG. 2. As such, the data values may be moved, e.g., in parallel, from the first sensing component stripe for the first subarray via the plurality of shared I/O lines and/or connection circuitry to the second sensing component stripe for the second subarray.

In various embodiments, the controller 140 may select, e.g., open via an appropriate select line, a first row of memory cells, which corresponds to the source location, for the first sensing component stripe to sense data stored therein, couple the plurality of shared I/O lines to the first sensing component stripe, and couple the second sensing component stripe to the plurality of shared I/O lines, e.g., via the column select circuitry 358-1, 358-2, 359-1, and 359-2 and/or the multiplexers 460-1 and 460-2. As such, the data values may be moved in parallel from the first sensing component stripe to the second sensing component stripe via the plurality of shared I/O lines. The first sensing component stripe may store, e.g., cache, the sensed data and the second sensing component stripe may store, e.g., cache, the moved data.

The controller 140 may select, e.g., open via an appropriate select line, a second row of memory cells, which corresponds to the destination location, for the second sensing component stripe, e.g., via the column select circuitry 358-1, 358-2, 359-1, and 359-2 and/or the multiplexers 460-1 and 460-2. The controller 140 may then direct writing the data moved to the second sensing component stripe to the destination location in the second row of memory cells.

The shared I/O line may be shared between some or all sensing component stripes. In various embodiments, one sensing component stripe or one pair of sensing component stripes, e.g., coupling a source location and a destination location, may communicate with the shared I/O line at any given time. As described herein, a source row of a source subarray, e.g., any one of 512 rows, may be different from, e.g., need not match, a destination row of a destination subarray, where the source and destination subarrays may, in various embodiments, be in the same or different banks and bank sections of memory cells. Moreover, a selected source column, e.g., any one of eight configured to be coupled to a particular shared I/O line, may be different from, e.g., need not match, a selected destination column of a destination subarray.

As described herein, an I/O line 455 may be shared by the second subset, e.g., the long digit line subarrays 426, and the sensing circuitry 424 of the first subset, e.g., the short digit line subarrays 425. The shared I/O line may be configured to selectably couple to the sensing circuitry of the first subset to enable movement of a data value stored in selected memory cells in a selected row in the second subset to the sensing circuitry of a selected subarray in the first subset.

The controller 140 may be configured to direct performance of a sequential plurality of operations on the data value in the sensing circuitry of the selected subarray in the first subset. The controller may, in some embodiments, be configured to direct movement of the data value from the sensing circuitry 450 of the selected subarray 425 in the first subset to a selected memory cell in a selected row in the selected subarray prior to performance of the sequential plurality of operations thereon by the sensing circuitry. For example, the data value may be moved from the sensing circuitry 450 to be stored in a memory cell in the short digit line subarray 425 before the sequential plurality of operations has been performed on the data value. The controller may, in some embodiments, be configured to direct movement of the data value from the sensing circuitry 450 of the selected subarray 425 in the first subset to a selected memory cell in a selected row in the selected subarray subsequent to performance of the sequential plurality of operations thereon by the sensing circuitry. For example, the data value may be moved from the sensing circuitry 450 to be stored in the memory cell in the short digit line subarray 425 after the sequential plurality of operations has been performed on the data value in the sensing circuitry 450. This may be the first time the data value is stored in the memory cell in the short digit line subarray 425 or the data value on which the sequential plurality of operations was performed may be stored by overwriting the data value previously stored in the memory cell.

The controller 140 may be configured to direct movement, via the shared I/O line 455, of the data value on which the sequential plurality of operations has been performed from the sensing circuitry 450 of the selected subarray in the first subset, e.g., a selected short digit line subarray 425, to a selected row in the selected subarray in the second subset, e.g., a selected long digit line subarray 426. A plurality of shared I/O lines 455-1, 455, 2, . . . , 455-M may be configured to selectably couple to the sensing circuitry 450 of the plurality of subarrays to selectably enable parallel movement of a plurality of data values stored in a row of the second subset to a corresponding plurality of sense amplifiers and/or compute components in selectably coupled sensing circuitry of the first subset. The plurality of shared I/O lines 455-1, 455, 2, . . . , 455-M may, in some embodiments, be configured to selectably couple to the sensing circuitry 450 of the plurality of subarrays to selectably enable parallel movement of a plurality of data values to selectably coupled sensing circuitry of the first subset from a corresponding plurality of sense amplifiers that sense the plurality of data values stored in a row of the second subset. In some embodiments, the plurality of sense amplifiers may be included without coupled compute components in the sensing circuitry for the second subset. The number of a plurality of shared I/O lines may, in some embodiments, correspond to a number of bits wide shared I/O line.

The sensing circuitry 450 described herein may be included in a plurality of sensing component stripes 424-0, . . . , 424-N−1 and each sensing component stripe may be physically associated with a respective subarray 425-0, . . . , 426-N−1 of the first and second subsets of the plurality of subarrays in the bank. A number of a plurality of sensing component stripes in a bank of the memory device may correspond to a number of the plurality of subarrays in the first and second subsets in the bank. Each sensing component stripe may be coupled to the respective subarray of the first and second subsets of the plurality of subarrays and the I/O line may be selectably shared by the sensing circuitry 450 in a coupled pair of the plurality of sensing component stripes.

As shown in sensing component stripe 424-0 associated with short digit line subarray 425-0, a sensing component stripe may be configured to include a number of a plurality of sense amplifiers 406 and compute components 431 that corresponds to a number of a plurality of columns 422 of the memory cells in the first subset configured for in-memory operations. The number of sense amplifiers and compute components in the sensing component stripe 424-0 may be selectably coupled to a shared I/O line, e.g., each of the respective sense amplifiers and/or compute components may be selectably coupled to one of shared I/O lines 455-1, 455, 2, . . . , 455-M.

As shown in sensing component stripe 424-N−1 associated with long digit line subarray 426-N−1, a sensing component stripe may be configured to include a number of a plurality of sense amplifiers 406, e.g., without compute components, that corresponds to a number of a plurality of columns 422 of the memory cells in the second subset configured for data storage. The number of sense amplifiers in the sensing component stripe 424-N−1 may be selectably coupled to a shared I/O line, e.g., each of the respective sense amplifiers may be selectably coupled to one of shared I/O lines 455-1, 455, 2, . . . , 455-M.

In some embodiments, the first subset, e.g., short digit line subarrays 425, of the plurality of subarrays may be a number of subarrays of PIM DRAM cells. By comparison, in some embodiments, the second subset, e.g., long digit line subarrays 426, of the plurality of subarrays may be, or may include, a number of subarrays of memory cells other than PIM DRAM cells. For example, as previously described, the memory cells of the second subset may be associated with sensing circuitry formed without compute components, such that the processing functionality is reduced or eliminated. Alternatively or in addition, memory cells of a type or types other than DRAM may be utilized in the long digit line subarrays for storage of data.

In various embodiments, as shown in FIGS. 1B and 1C, a number of subarrays in the first subset may correspond to a number of subarrays in the second subset, e.g., configured in a 1:1 ratio. For example, as shown in FIG. 1C, each of the number of subarrays in the first subset may be physically associated with a respective subarray in the second subset. Alternatively or in addition, as shown in FIG. 1B, the number of subarrays in the first subset may be physically associated with each other as a first block and the number of subarrays in the second subset also may be physically associated with each other as a second block. These alternative configurations may vary between banks and/or partitions of the bank. In some embodiments, a number of subarrays in the first subset may correspond to a respective plurality of subarrays in the second subset, e.g., where a subarray in the first subset is configured in 1:2, 1:4, and/or 1:8, etc., ratios relative to the plurality of subarrays in the second subset. For example, each of the number of subarrays in the first subset may be physically associated with the respective plurality of subarrays in the second subset, e.g., one subarray in the first subset may be adjacent four subarrays in the second set, which may be followed by another one subarray in the first subset adjacent to four subarrays in the second set, etc.

The memory device 120 described herein may include the first subset of a plurality of subarrays, the second subset of the plurality of subarrays, and a plurality of partitions, e.g., 128-0, 128-1, . . . , 128-M−1 in FIG. 1C, where each partition of the plurality of partitions may, in some embodiments, include at least one subarray from the respective first subset 125 and at least one subarray from the respective second subset 126. The memory device 120 may include an I/O line 155 shared by the partitions. The shared I/O line 155 may include a plurality of portions, e.g., which may correspond to the length of the partitions 128-0, 128-1, . . . , 128-M−1. Isolation circuitry may be configured to selectably connect a first portion of the plurality of portions of the shared I/O line with a second portion of the shared I/O line, where the first portion corresponds to a first partition, e.g., 128-0, of the plurality of partitions and the second portion corresponds to a second partition, e.g., 128-1, of the plurality of partitions.

In some embodiments, result data values on which a sequential plurality of operations have been performed in a short digit line cache subarray may be returned to the same long digit line storage subarray from which the data values were originally sent and/or the data values on which the operation has been performed may be returned for storage in a long digit line subarray that is different from the storage subarray from which the data values were originally sent. Hence, the result data values on which the sequential plurality of operations have been performed may be returned for storage in more than one long digit line subarray. Alternatively or in addition, the original data values may be obtained from and/or the result data values may be sent to at least one of the number of bank registers 158 and/or vector registers 159 described herein.

As described herein, the controller 140 may be coupled to a bank, e.g., 121, of a memory device, e.g., 120, to execute a command to perform a sequential plurality of operations. An I/O line, e.g., 455-1, 455-2, . . . , 455-M in FIGS. 4A and 4B, may be shared by the second subset 426 and the sensing circuitry 450 of the first subset 425. The shared I/O line may be configured to selectably couple to the sensing circuitry of the first subset to enable movement of a number of data values stored in the second subset to the sensing circuitry of a selected subarray in the first subset. As described herein, the controller 140 is configured to direct the performance of the sequential plurality of operations in-memory on the number of data values in the sensing circuitry 450 of the selected subarray, e.g., 425-0, in the first subset.

The controller 140 may, in some embodiments, be configured to direct movement of the number of data values from the sensing circuitry, e.g., 450-0, 450-1, . . . , 450-X−1, of the selected subarray, e.g., 425-0, in the first subset to a number of selected rows 119 of the selected subarray prior to performance of the sequential plurality of operations thereon by the sensing circuitry. Alternatively or in addition, the controller 140 may be configured to direct movement of the number of data values from the sensing circuitry of the selected subarray in the first subset to a number of selected rows of the selected subarray subsequent to performance of the sequential plurality of operations thereon by the sensing circuitry.

The controller 140 may, in some embodiments, be configured to direct movement, via the shared I/O line, e.g., 455-1, of a data value resulting from performance of the sequential plurality of operations from the sensing circuitry, e.g., 450-, 450-1, . . . , 450-X−1, of the selected subarray, e.g., 425-0, in the first subset to a selected subarray, e.g., 425-N−1, in the second subset. A plurality of shared I/O lines, e.g., 455-1, 455-2, . . . , 455-M, may be configured to selectably couple to the sensing circuitry of the plurality of subarrays, e.g., sensing circuitry 450-0, 450-1, . . . , 450-X−1 of subarrays 425-0 and 426-N−1, to selectably enable parallel movement of a plurality of data values stored in the second subset to a corresponding plurality of sense amplifiers and/or compute components in selectably coupled sensing circuitry of the first subset. The plurality of shared I/O lines may be configured to selectably couple to the sensing circuitry of the plurality of subarrays to selectably enable parallel movement of the plurality of data values to selectably coupled sensing circuitry, e.g., including sense amplifiers 406 and compute components 431, of the first subset 425 from a corresponding plurality of sense amplifiers, e.g., 406-0, 406-1, . . . , 406-X−1, that sense the plurality of data values stored in the second subset 426. The plurality of sense amplifiers, e.g., 406-0, 406-1, . . . , 406-X−1, may be included in the sensing circuitry, e.g., 450-0, 450-1, . . . , 450-X−1, for the second subset 426. In some embodiments, the sensing circuitry for the second subset 426 may not include compute components 431, in contrast to the sensing circuitry for the first subset 425.

In some embodiments, the memory device 120 may include a number of, e.g., one or more, bank registers 158 selectably coupled to the controller 140. As described herein, the controller 140 may be configured to direct performance of a sequential plurality of operations in-memory on the number of data values in the sensing circuitry of the selected subarray in the first subset and movement of a data value, resulting from the performance of the sequential plurality of operations, from the sensing circuitry to a selected destination. The selected destination may, for example, be a selected row 119 in a selected subarray of the first subset 425, a selected row 118 in a selected subarray of the second subset 426, and/or a selected row (not shown) in a selected bank register 158.

The memory device 120 may, in some embodiments, include an I/O line, e.g., as shown at 155 and described in connection with FIG. 1C, shared by the sensing circuitry of a selected subarray of the first subset, e.g., sensing component stripe 424-0 in FIGS. 4A and 4B, and the sensing circuitry of a selected subarray of the second subset, e.g., sensing component stripe 424-N−1 in FIGS. 4A and 4B, and the selected bank register 158. The shared I/O line may be configured to selectably couple to the sensing circuitry of the first subset to enable movement of a number of result data values stored in the first subset 425 to the selected destination, e.g., the selected row 118 in the selected subarray of the second subset 426 and/or the selected row in a selected bank register 158.

In some embodiments, the memory device 120 may include a number of, e.g., one or more, vector registers 159 selectably coupled to the controller 140. Accordingly, as shown in and described in connection with FIG. 1C, the I/O line shared by the sensing circuitry of the selected subarray of the first subset and the sensing circuitry of the selected subarray of the second subset, and the selected bank register, may be further shared by a selected vector register 159. In some embodiments, the number of result data values stored in the first subset may be moved to the selected destination, which in addition to the selected row 118 in the selected subarray of the second subset 426, may include the selected row in a selected bank register 158 and/or a selected row (not shown) in the vector register 159.

In some embodiments, control logic, e.g., connected to and/or a part of controller 140 and/or logic circuitry 170, may be in the form of a microcode engine (not shown) responsible for fetching and executing machine instructions, e.g., microcode instructions, from an instruction cache 171, array 130, and/or host 110 in FIGS. 1A and 1B. The microcode engine may also be in the form of a number of microcode engines and/or ALU circuitry. The microcode engine may be configured to execute a set of instructions to direct movement of a number of data values from a corresponding number of memory cells selected from a source row in the first subset, e.g., from rows 119 in subset 425, or the second subset, e.g., from rows 118 in subset 426, of the plurality of subarrays to a corresponding number of memory cells in the selected row in the selected bank register 158 and/or a selected row in a selected vector register 159.

The microcode engine may be further configured to execute a set of instructions to selectably direct storage of the data value in the selected subarray in the second subset 426, the selected row in the selected bank register 158, and/or the selected row in the vector register 159. The storage of the respective data value may be selectably offset a number of memory cells in the selected destination relative to storage of the respective data value in a memory cell in a source row 119 of the first subset 425. In some embodiments, a first number of memory cells in the selected source row 119 in the first subset may differ from a second number of memory cells in at least one of the source row 118 in the second subset 426, the selected row in the selected bank register 158, and/or the selected row in the vector register 159.

In some embodiments, the memory device 120 may include an I/O line, e.g., 455-1, 455-2, . . . , 455-M, shared by the sensing circuitry 450 of a selected subarray, e.g., 425-0, of the first subset and the sensing circuitry 450 of a selected subarray, e.g., 426-N–1, of the second subset, the selected bank register 158, and a selected vector register 159. The microcode engine may be configured to execute a set of instructions to direct the shared I/O line to selectably couple to the sensing circuitry of the first subset and the second subset to selectably enable movement of a number of result data values stored in the first subset 425 and/or the second subset 426 to the selected destination. In various embodiments, the selected destination may be the selected row in the selected bank register 158 and/or the selected row in the selected vector register 159.

In some embodiments, the memory device 120 may include, in addition to or instead of the shared I/O lines described herein, connection circuitry, e.g., as shown at 232-1 and 232-2 and described in connection with FIG. 2. The connection circuitry may be configured to connect, e.g., as shown at 217-1 and 217-2, sensing circuitry coupled to a particular column, e.g., columns 422-0, 422-1, . . . , 422-X–1 in FIGS. 4A and 4B, in a number of subarrays in the second subset, e.g., long digit line subarrays 126-0, 126-1, . . . , 126-N–1 as shown in and described in connection with FIG. 1C, to a number of rows in a corresponding column in a first subarray in the first subset, e.g., short digit line subarray 125-0. The microcode engine may be configured to execute a set of instructions to direct the connection circuitry to move a plurality of data values from the number of subarrays in the second subset to a corresponding plurality of selected rows 119 and the corresponding column in the first subarray in the first subset for performance of the sequential plurality of operations. The plurality of selected rows and the corresponding column in the first subarray in the first subset may be configured, e.g., opened, to receive the plurality of data values.

The controller 140 may direct the performance of the sequential plurality of operations on the plurality of data values in the sensing circuitry 250 of the first subarray, e.g., 125-0, in the first subset. For example, in some embodiments, the memory device 120 may be configured to move a plurality of data values from one or more of the long digit line subarrays 126-0, 126-1, . . . , 126-N–1, e.g., either sequentially or in parallel, to selected rows 119 of the selected short digit line subarray 125-0 to enable performance of the sequential plurality of operations thereon.

The connection circuitry 232 may be further configured to selectably couple to the sensing circuitry, e.g., sense amplifier 206 and compute component 231, of the first subset 425 and the sensing circuitry, e.g., sense amplifier 206, of the second subset 426 to selectably enable movement of a number of result data values stored in the first subset 425 and the second subset 426 to the selected destination. Similar to the shared I/O lines, the selected destination may be the selected row in the selected bank register 158 and/or the selected row in the selected vector register 159.

As such, a directed data movement, via the first portion of the shared I/O line, e.g., corresponding to partition 128-0, may be from a first subarray in the first subset, e.g., short digit line subarray 125-0, subsequent to performance of a sequential plurality of operations by sensing circuitry of the first subarray on a first data value, to a third subarray in the second subset, e.g., long digit line subarray 126-1. In some embodiments, a directed data movement, via the second portion of the shared I/O line, e.g., corresponding to partition 128-1, may be from a second subarray in the first subset, e.g., short digit line subarray 125-2, subsequent to performance of the sequential plurality of operations by sensing circuitry of the second subarray on a second data value, to a fourth subarray in the second subset, e.g., long digit line subarray 126-2 (not shown). For example, the directed data movement may be within the first partition, e.g., 128-0, and/or the directed data movement may be, e.g., performed in parallel, within the second partition, e.g., 128-1.

The controller 140 may, in various embodiments, be configured to selectably direct isolation circuitry (not shown) to connect the first portion, e.g., corresponding to partition 128-0, to the second portion, e.g., corresponding to any partition 128-1, . . . , 128-M–1, during a directed data movement. The directed data movement, via the connected first and second portions of the shared I/O line, may be from a subarray in the second subset in the second portion, e.g., long digit line subarray 126-N–1, to a subarray in the first subset in the first portion, e.g., short digit line subarray 125-0. The controller 140 also may, in various embodiments, be configured to selectably direct the isolation circuitry to connect the first portion to the second portion during a directed data movement, where the directed data movement, via the connected first and second portions of the shared I/O line, may be from the subarray in the first subset in the first portion, e.g., short digit line subarray 125-0, subsequent to performance of the sequential plurality of operations on a data value, to a subarray in the second subset in the second portion, e.g., long digit line subarray 126-N-1 from which the data value was originally sent and/or to any other long digit line subarray in partitions 128-1, . . . , 128-M-1.

The number of subarrays may, in various embodiments, may differ between a plurality of partitions in a bank and/or between banks. The ratio of long digit line subarrays to short digit line subarrays, or whether either type of subarray is present in a partition before connection of partitions, also may differ between a plurality of partitions in a bank and/or between banks.

As described herein, a sensing component stripe, e.g., 424-N-1, may include a number of sense amplifiers configured to move an amount of data sensed from a row, e.g., one or more of rows 118, of a first subarray in the second subset, e.g., long digit line subarray 426-N-1, in parallel to a plurality of shared I/O lines, e.g., 455-1, 455-2, . . . , 455-M, where the amount of data corresponds to at least a thousand bit width of the plurality of shared I/O lines. A sensing component stripe, e.g., 424-0, associated with a first subarray in the first subset, e.g., short digit line subarray 425-0, may include a number of sense amplifiers 406 and compute components 431 configured to receive, e.g., cache, an amount of data sensed from the row of the first subarray in the second subset and moved in parallel via the plurality of shared I/O lines. The controller 140 may be configured to direct performance of a sequential plurality of operations on at least one data value in the received amount of data by at least one compute component in the sensing component stripe associated with short digit line subarray.

Although the description herein has referred to a few portions and partitions for purposes of clarity, the apparatuses and methods presented herein may be adapted to any number of portions of the shared I/O lines, partitions, subarrays, and/or rows therein. For example, the controller 140 may send signals to direct connection and disconnection via the isolation circuitry of respective portions of the shared I/O lines from a first subarray in a bank to a last subarray in the bank to enable data movement from a subarray in any partition to a subarray in any other partition, e.g., the partitions may be adjacent and/or separated by a number of other partitions. In addition, although two disconnected portions of the shared I/O lines were described to enable parallel data movement within two respective paired partitions, the controller 140 may send signals to direct connection and disconnection via the isolation circuitry of any number of portions of the shared I/O lines to enable parallel data movement within any number of respective paired partitions. Moreover, the data may be selectably moved in parallel in the respective portions of the shared I/O lines in either of the first direction and/or the second direction.

As described herein, a method is provided for operating a memory device 120 to perform in-memory operations by execution of non-transitory instructions by a processing resource. The method may include performing a sequential plurality of operations in-memory on a plurality of data values. The number of the plurality of data values may correspond to a number of sense amplifiers 406 and/or compute components 431 in a first sensing component stripe, e.g., 424-0, coupled to receive and/or operate on the plurality of data values moved to a selected first subarray, e.g., 425-0, from a selected second subarray, e.g., 426-0. The sequential plurality of operations may be performed subsequent to sensing the plurality of data values in the selected second subarray and moving the plurality of sensed data values to the first sensing component stripe coupled to the selected first subarray.

For example, a data value may be sensed in a selected memory cell in a selected first row, e.g., one or more of rows 118, of a selected second subarray, e.g., long digit line subarray 426-N-1, in a bank 121 of the memory device. The sensed data value may be moved to a first sensing component stripe, e.g., 424-0, coupled to a selected first subarray, e.g., short digit line subarray 425-0, in the bank. In some embodiments, the selected first subarray may be configured with a number of memory cells in a column of the selected first subarray that is at most half of a number of memory cells in a column of the selected second subarray. A sequential plurality of operations may be performed on the sensed data value in the first sensing component stripe coupled to the selected first subarray. As described herein, a result data value on which the sequential plurality of operations has been performed may be moved from the first sensing component stripe, e.g., 424-0, to a memory cell in a selected row in a selected subarray, e.g., short digit line subarrays 425 and/or long digit line subarrays 426, and/or to a memory cell in a selected row in a register, e.g., bank registers 158 and/or vector registers 159.

In various embodiments, the method may include sequentially storing the plurality of sensed data values in a second sensing component stripe, e.g., 424-N-1, in the bank coupled to the selected second, e.g., short digit line subarray 426-N-1, and moving the plurality of sensed data values from the second sensing component stripe to the first sensing component stripe coupled to the selected first subarray.

A first data value, resulting from the performance of the sequential plurality of operations, may be moved from the first sensing component stripe, e.g., 424-0 of short digit line array 425-0, to a selected first row 119 of the selected first subarray. The resulting first data value may be stored in the selected first row 119 of the selected first subarray, e.g., short digit line subarrays 425-0.

In some embodiments, the method may further include performing another operation on the resulting first data value, moved from the selected first row, by the first sensing component stripe coupled to the selected first subarray. A second data value resulting from performance of the other operation may be stored in a selected second row of the selected first subarray. In some embodiments, the method may further include moving the resulting first data value from the selected first row of the selected first subarray to a selected second row of the selected first subarray. Subsequent to moving the resulting first data value to the selected second row of the selected first subarray, another operation may be performed on the resulting first data value by the first sensing component stripe coupled to the selected first subarray, e.g., sensing component stripe 424-0 of short digit line array 425-0.

Alternatively or in addition, the method may further include performing the sequential plurality of operations on the plurality of sensed data values in the first sensing component stripe coupled to the selected first subarray, e.g., sensing component stripe 424-0 of short digit line array 425-0. A data value resulting from the performance of the sequential plurality of operations may be moved from the first sensing component stripe to a selected row in the second subarray, e.g., row 118 in long digit line subarray 425-N-1.

The result data value on which the sequential plurality of operations has been performed may, in various embodiments, be selectably moved to a number of locations, where the result data value being moved to one location does not preclude the result data value being moved to one or more other locations. For instance, the result data value may be moved from the sensing component stripe, e.g., 424-0, to the selected memory cell in the selected first row of the selected first subarray in a same bank of the memory device. For example, the result data value on which the sequential plurality of operations has been performed may be returned to the memory cell from which it was originally sent. The result data value may be moved from the sensing component stripe to a selected memory cell in a selected second row of the selected second subarray in the same bank. For example, the result data value may be returned to a memory cell in a different row in the subarray from which it was sent. The result data value may be moved from the sensing component stripe to a selected memory cell in a selected row in a selected second subarray in the same bank. For example, the result data value may be returned to a memory cell in a row of a subarray that is a different subarray from which it was sent.

The result data value may be moved from the sensing component stripe to a selected memory cell in each of a plurality of selected rows of the selected second subarray in the same bank. For example, the result data value may be returned to a memory cell in each of more than one row in the subarray from which it was sent. The result data value may be moved from the sensing component stripe to a selected memory cell in each of a plurality of selected rows, where each selected row is in a respective subarray of a plurality of subarrays in the same bank. For example, the result data value may be returned to a memory cell in each of more than one row, where each row is in a different subarray in the bank from which it was sent.

In some embodiments, the result data value may be moved from the sensing component stripe to a selected memory cell in a selected row in a selected subarray in a different bank. For example, the result data value on which the sequential plurality of operations has been performed may be returned to a memory cell in a subarray that is in a different bank of the memory device from which it was sent. Although movement of data values via the shared I/O line may be within the same bank, the connection circuitry 232-1 and 232-2 described in connection with FIG. 2 may be utilized for data movement between banks.

As described herein, the method may, in some embodiments, include storing the sensed data value in a second sensing component stripe, e.g., 424-N-1, coupled to the selected second subarray, e.g., 426-N-1. The sensed data value may be moved from the second sensing component stripe to a first sensing component stripe, e.g., 424-0, coupled to the selected first subarray, e.g., 425-0. The sensed data value may be stored in a memory cell in a selected second row, e.g., one or more of rows 119, of the selected first subarray. In various embodiments, the sensed data value may be stored in the selected first subarray prior to and/or subsequent to performance of the operation thereon.

The method may include performing a plurality, e.g., a sequence, of operations on the sensed data value in the sensing component stripe coupled to the selected first subarray. For example, a number of data values may be moved from a row of a long digit line subarray, e.g., 426-N-1, to a short digit line subarray, e.g., 425-0, for performance of a sequence of operations with a speed, rate, and/or efficiency that is improved relative to return of a result of each operation in the sequence to a long digit line subarray. Each operation may be performed in the sensing component stripe coupled to the short digit line subarray with the improved speed, rate, and/or efficiency and that advantage may be proportionally increased with each additional operation in the sequence of operations. The result data value on which the plurality of operations has been performed may be moved from the sensing component stripe to a memory cell in a selected row in a selected subarray and/or register in a number of locations, as described herein.

The method may, in some embodiments, include selectably coupling a first sensing component stripe, e.g., 424-0, coupled to the selected first subarray, e.g., 425-0, and a second sensing component stripe, e.g., 424-N-1, coupled to the selected second subarray, e.g., 426-N-1, via an I/O line, e.g., 455-1, shared by the first and second sensing component stripes. The method may include moving, via the shared I/O line, the plurality of sensed data values from the second sensing component stripe coupled to the selected second subarray to the first sensing component stripe coupled to the selected first subarray. The method may, in various embodiments, include performing the sequential plurality of operations by the first sensing component stripe without movement of a result of the respective plurality of operations to the second sensing component stripe, or a memory cell, of the second subarray prior to completion of a last of the sequential plurality of operations. The method may include moving, via the shared I/O line, e.g., which may be different from the previous shared I/O line, a data value resulting from completion of the last of the sequential plurality of operations from the first sensing component stripe, e.g., 424-0, to the second sensing component stripe, e.g., 424-N-1, or the memory cell, of the second subarray e.g., one or more subarrays selected from 426-0, . . . , 426-N-1. The data value resulting from completion of the sequential plurality of operations may be written to at least one selected memory cell of at least one selected row 118 in the selected first subarray.

While example embodiments including various combinations and configurations of controller, short digit line subarrays, long digit line subarrays, bank registers, vector registers, sensing circuitry, sense amplifiers, compute components, sensing component stripes, shared I/O lines, column select circuitry, multiplexers, connection circuitry, etc., have been illustrated and described herein, embodiments of the present disclosure are not limited to those combinations explicitly recited herein. Other combinations and configurations of the controller, short digit line subarrays, long digit line subarrays, bank registers, vector registers, sensing circuitry, sense amplifiers, compute components, sensing component stripes, shared I/O lines, column select circuitry, multiplexers, connection circuitry, etc., disclosed herein are expressly included within the scope of this disclosure.

Although specific embodiments have been illustrated and described herein, those of ordinary skill in the art will appreciate that an arrangement calculated to achieve the same results may be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure must use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A system, comprising:
a host configured to selectably allocate locations for storage of data in a first subset of a plurality of subarrays of memory cells and a second subset of the plurality of subarrays,
wherein allocation is based at least in part on whether first sensing circuitry coupled to the first subset is configured to be used in performance of compute operations and second sensing circuitry coupled to the second subset is not configured to be used in performance of compute operations; and
a memory device coupled to the host, the memory device comprising:
the first subset and the second subset of the plurality of subarrays; and
the first sensing circuitry coupled to the first subset comprising a sense amplifier and a compute component configured to be used in performance of the compute operations.

2. The system of claim 1, wherein the first subset is configured to be used in performance of the compute operations.

3. The system of claim 1, wherein the memory device further comprises:
the second sensing circuitry coupled to the second subset comprising a sense amplifier and no compute component;
wherein the second subset is not configured to be used in performance of the compute operations.

4. The system of claim 1, wherein the memory device further comprises:
the second sensing circuitry coupled to the second subset comprising a sense amplifier;
wherein the second subset is used for storage of a data value prior to movement of the data value to the first sensing circuitry of the first subset for performance of a compute operation thereon.

5. The system of claim 1, wherein the memory device further comprises control circuitry configured to decode signals provided by a control bus from the host to direct movement of the data, consistent with the allocation to the locations, and performance of the compute operations on the data.

6. The system of claim 1, wherein:
the host is further configured to generate instructions to be provided to control circuitry of the memory device; and
the instructions comprise commands for movement of the data, consistent with the allocation to the locations, and performance of the compute operations on the data.

7. The system of claim 1, wherein:
the host is further configured to generate instructions to be provided to control circuitry of the memory device; and
the instructions to the control circuitry selectably comprise:
a first command to direct storage of the data in a particular subarray of the first subset that enables performance of a compute operation thereon using the first sensing circuitry; and
a second command to direct storage of the data, using the second sensing circuitry, in a particular subarray of the second subset.

8. The system of claim 1, wherein:
the host is further configured to generate instructions to be provided to control circuitry of the memory device; and
the instructions comprise a command to the control circuitry for movement of the data, stored in a particular subarray of the second subset, to the first sensing circuitry of the first subset for performance of a compute operation thereon.

9. The system of claim 1, wherein a compute operation is a logical operation performed on data values stored by memory cells of the plurality of subarrays.

10. A method of operating a system, comprising:
selectably allocating, by a host, locations for storage of data in a first subset of a plurality of subarrays of memory cells and a second subset of the plurality of subarrays, wherein:
allocation is based at least in part on a first access time to memory cells of a first subarray in the first subset being shorter than a second access time to memory cells of a second subarray in the second subset; and
the system further comprises a memory device comprising:
the first subset and the second subset of the plurality of subarrays; and
a first number of memory cells in a column of the first subarray of the first subset that is less than a second number of memory cells in a column of the second subarray of the second subset; and
accessing the first number of memory cells of the first subarray in the first subset in the shorter first access time based at least in part on the first number of memory cells being less in the first subarray relative to the second number of memory cells in the second subarray.

11. The method of claim 10, further comprising performing compute operations faster using sensing circuitry coupled to the first subset based on the shorter first access time to the memory cells of the first subarray relative to potential compute operations that include the second access time.

12. The method of claim 10, further comprising the allocating being further based on:
increasing speed of operations performed using subarrays in the first subset having the shorter first access time relative to operations potentially performed using subarrays in the second subset having a longer second access time; and
increasing efficiency of data storage using subarrays in the second subset having a greater number of memory cells.

13. The method of claim 10, wherein the first number of memory cells in the column of the first subarray in the first subset is at most half of the second number of memory cells in the column of the second subarray in the second subset.

14. The method of claim 10, further comprising accessing the first number of memory cells of the first subarray in the first subset in the shorter first access time based at least in part on a first length of a sense line of the first subarray being at most half of a second length of a sense line of the second subarray.

15. The method of claim 10, further comprising:
coupling, to the first subset, sensing circuitry comprising a sense amplifier and a compute component configured to be used in performance of compute operations; and
performing a compute operation faster using the compute component of the sensing circuitry by the shorter access time to the first number of memory cells of the first subarray relative to a potential compute operation that includes the second access time to the second number of memory cells of the second subarray.

16. A system, comprising:
a host configured to selectably allocate locations, in one or more banks of memory cells, to hold data,
wherein allocation is based at least in part on particular operations to be performed on the data using sensing circuitry configured to perform the particular operations at the locations; and
a memory device comprising a plurality of banks of memory cells, wherein each of the respective banks comprises control circuitry configured to:
decode instructions received from the host for the allocation to a particular location in a bank and for performance of the particular operations;
direct performance of at least one of the particular operations on the data using the sensing circuitry at the particular location; and
direct movement of the data in the plurality of banks to enable performance of an additional operation of the particular operations.

17. The system of claim 16, wherein the host comprises a controller configured, based on particular sensing circuitry at the locations being configured to perform the particular operations, to send the instructions, to control circuitry of the one or more banks, for the allocation to the locations and for performance of the particular operations.

18. The system of claim 16, wherein the control circuitry for each of the respective banks is further configured to send to the host status information concerning the allocation to the locations, the performance of the particular operations, and the movement of the data in the plurality of banks.

19. The system of claim 16, wherein:
the locations are at least two subarrays of memory cells in one bank;
a first subarray in the one bank is coupled to first sensing circuitry, comprising a sense amplifier and a compute component, configured to be used in performance of compute operations; and
a second subarray in the one bank is coupled to second sensing circuitry, comprising a sense amplifier and no compute component, configured to be used in performance of data read, write, and storage operations but not in performance of compute operations.

20. The system of claim 16, wherein:
the locations are at least a first subarray of memory cells in a first bank and at least a second subarray of memory cells in a second bank;
the first subarray is coupled to first sensing circuitry, comprising a sense amplifier and a compute component, configured to be used in performance of compute and data movement operations; and
the second subarray is coupled to second sensing circuitry, comprising a sense amplifier and no compute component, configured to be used in performance of data storage and movement operations;
wherein the second subarray is used for storage of a data value in the second bank prior to movement of the data value, using the second sensing circuitry, to the first sensing circuitry in the first bank for performance of a compute operation thereon.

* * * * *